(12) United States Patent
Kim et al.

(10) Patent No.: US 11,703,711 B2
(45) Date of Patent: Jul. 18, 2023

(54) LUMINOUS BODY, AND LIGHT EMITTING FILM, LIGHT EMITTING DIODE AND LIGHT EMITTING DEVICE INCLUDING THE SAME

(71) Applicant: LG DISPLAY CO., LTD., Seoul (KR)

(72) Inventors: Byung-Geol Kim, Paju-si (KR); Hye-Li Min, Paju-si (KR); Dong-Young Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 1054 days.

(21) Appl. No.: 16/200,170

(22) Filed: Nov. 26, 2018

(65) Prior Publication Data
US 2019/0163016 A1     May 30, 2019

(30) Foreign Application Priority Data
Nov. 28, 2017 (KR) .......................... 10-2017-0160423

(51) Int. Cl.
*H01L 33/50*     (2010.01)
*H01L 33/52*     (2010.01)
(Continued)

(52) U.S. Cl.
CPC .. *G02F 1/133603* (2013.01); *G02F 1/133606* (2013.01); *G02F 1/133609* (2013.01);
(Continued)

(58) Field of Classification Search
CPC ....... H01L 33/06; H01L 33/50; H01L 33/501; H01L 33/502; H01L 33/504;
(Continued)

(56) References Cited

U.S. PATENT DOCUMENTS 9,425,365 B2    8/2016    Kurtin
9,478,717 B2    10/2016    Mangum et al.
(Continued)

FOREIGN PATENT DOCUMENTS

CN    105051152 A    11/2015
CN    105742320 A    7/2016
(Continued)

OTHER PUBLICATIONS

"High Efficient OLED Displays Prepared with the Air-Gapped Bridges on Quantum Dot Patterns for Optical Recycling," Scientific Reports, Published Feb. 17, 2017, 8 pages.
(Continued)

*Primary Examiner* — Matthew E. Hoban
*Assistant Examiner* — Lynne Edmondson
(74) *Attorney, Agent, or Firm* — Birch, Stewart, Kolasch & Birch, LLP

(57) ABSTRACT

The present invention provides a luminous body, and light emitting film, light emitting diode and light emitting device including the same. The luminous body can include a plurality of emission moieties each including an inorganic emission particle and a coating layer surrounding a surface of the inorganic emission particle, and an encapsulation moiety connected to the coating layer and surrounding the plurality of emission moieties. The present invention further provides a light emitting film, a liquid crystal display device, a light emitting diode package, a light emitting diode and a light emitting display device including the luminous body.

18 Claims, 15 Drawing Sheets

(51) Int. Cl.
  *G02F 1/13357* (2006.01)
  *H01L 33/06* (2010.01)
  *H10K 50/00* (2023.01)
  *H10K 50/115* (2023.01)
  *H10K 59/38* (2023.01)
  *H01L 25/16* (2023.01)
  *H10K 102/00* (2023.01)

(52) U.S. Cl.
  CPC ........ *G02F 1/133611* (2013.01); *H01L 33/06* (2013.01); *H01L 33/50* (2013.01); *H01L 33/502* (2013.01); *H10K 50/00* (2023.02); *H10K 50/115* (2023.02); *H10K 59/38* (2023.02); *H01L 25/167* (2013.01); *H01L 33/501* (2013.01); *H01L 33/504* (2013.01); *H10K 2102/331* (2023.02)

(58) Field of Classification Search
  CPC ....... H01L 33/508; H01L 33/54; H01L 33/56; H01L 33/44; H01L 33/52; H01L 33/58; H01L 51/50; H01L 51/502; H01L 25/167; H01L 25/156; H01L 27/322; H01L 2251/5369; G02F 1/133603; G02F 1/133606; G02F 1/133609; G02F 1/133611; G02F 1/133614; G02F 1/134363; G02F 1/136227
  See application file for complete search history.

(56) References Cited

U.S. PATENT DOCUMENTS

| | | | |
|---|---|---|---|
| 9,722,147 B2 | 8/2017 | Mangum et al. | |
| 9,825,205 B2 | 11/2017 | Haley et al. | |
| 10,103,345 B2* | 10/2018 | Yoon | H01L 29/6609 |
| 10,962,835 B2* | 3/2021 | Min | H01L 33/502 |
| 11,222,997 B2* | 1/2022 | Kim | H05B 33/14 |
| 2008/0050851 A1* | 2/2008 | Tanaka | H01L 21/76802 |
| | | | 257/E21.477 |
| 2009/0294742 A1 | 12/2009 | Jang et al. | |
| 2010/0276638 A1 | 11/2010 | Liu et al. | |
| 2010/0291374 A1 | 11/2010 | Akarsu et al. | |
| 2011/0180766 A1 | 7/2011 | Jang et al. | |
| 2015/0285444 A1 | 10/2015 | Choi et al. | |
| 2016/0161088 A1* | 6/2016 | Sung | G02B 1/04 |
| | | | 362/97.1 |
| 2016/0230088 A1 | 8/2016 | Puetz et al. | |
| 2017/0029697 A1 | 2/2017 | Ghosh et al. | |
| 2017/0162764 A1* | 6/2017 | Kan | C09K 11/565 |

FOREIGN PATENT DOCUMENTS

| | | |
|---|---|---|
| CN | 106486510 A | 3/2017 |
| CN | 106537608 A | 3/2017 |
| JP | 5026668 B2 | 9/2012 |
| JP | 2013-505347 A | 2/2013 |
| KR | 10-2013-0045095 A | 5/2013 |
| KR | 10-2014-0102211 A | 8/2014 |
| KR | 10-2017-0026963 A | 3/2017 |
| WO | WO 2011/133228 A2 | 10/2011 |
| WO | WO 2014/064555 A1 | 5/2014 |

OTHER PUBLICATIONS

"Polysiloxane Functionalized Carbon Dots and their Cross-Linked Flexible Silicone Rubbers for Color Conversion and Encapsulation of White LEDs," Applied Materials & Interfaces, Apr. 1, 2016, 2 pages.

* cited by examiner

600

600B

QD PR         QD SIOC

LUMINOUS BODY, AND LIGHT EMITTING FILM, LIGHT EMITTING DIODE AND LIGHT EMITTING DEVICE INCLUDING THE SAME

CROSS-REFERENCE TO RELATED APPLICATIONS

This application claims priority to and the benefit of Korean Patent Application No. 10-2017-0160423 filed in the Republic of Korea on Nov. 28, 2017, which is hereby incorporated by reference in its entirety into the present application.

BACKGROUND OF THE INVENTION

Field of the Invention

Embodiments of the invention relate to a luminous body, and more particularly, to a luminous body having an improved dispersion property with respect to various solvents and an improved emission property, and a light emitting film, a light emitting diode and a light emitting device including the same.

Discussion of the Related Art

Recently, as the information and communication technology and the electronic engineering technology have been developed, a flat panel display device instead of the cathode ray tube display device has been researched. For example, a liquid crystal display (LCD) device and an organic light emitting diode (OLED) display device, which have advantages of thin profile and light weight, have been introduced.

Among the flat panel display device, the OLED display device including an organic light emitting diode as a self-emission type has excellent characteristics of thin profile and light weight without a backlight unit required in the LCD device. In addition, the OLED display device has advantages of low power consumption, low-voltage driving and fast response time. Further, since the fabricating process of the OLED display device is very simple, the OLED display device has a big advantage in the production cost.

In the OLED display device, the red light, the green light and the blue light are respectively emitted from a red emitting layer, a green emitting layer and a blue emitting layer formed in a red pixel region, a green pixel region and a blue pixel region such that a full-color image is provided. In the related art OLED display device, a thermal deposition process using a fine metal mask is used to form the red emitting layer, the green emitting layer and the blue emitting layer. However, there is a limitation in the fine metal mask thermal deposition process to fabricate large-size display devices. Accordingly, a white organic light emitting diode (W-OLED) display device, which includes a white emitting diode formed in the entire of the pixel regions and uses a color filter, having a red/green/blue/white pixel structure, is introduced.

FIG. 1 is a schematic view showing a related art W-OLED display device 1. As shown in FIG. 1, the W-OLED display device 1 includes a first substrate 10, where red, green, blue and white pixel regions Rp, Gp, Bp and Wp are defined, a second substrate 20 facing the first substrate 10, an organic light emitting diode 30 on the first substrate 10, and a color filter layer 40 on the second substrate 20. The color filter layer 40 corresponds to the red, green and blue pixel regions Rp, Gp and Bp.

Although not shown, a driving element such as a thin film transistor (TFT) can be positioned in each pixel region and on the first substrate 10, and the organic light emitting diode 30 can include a first electrode, an organic emitting layer and a second electrode. The first electrode can be patterned in each pixel region and can be connected to the driving element.

The color filter layer 40 includes red, green and blue color filter patterns 42, 44 and 46 respectively corresponding to the red, green and blue pixel regions Rp, Gp and Bp. The white light emitted from the organic light emitting diode 30 passes through the red, green and blue color filter patterns 42, 44 and 46, respectively, such that the W-OLED display device 1 provides the full-color image.

In the related art W-OLED display device 1, since the white light from the organic light emitting diode 30 is partially absorbed in the color filter layer 40, the optical efficiency or the emission efficiency of the W-OLED display device 1 is decreased. Namely, when the white light from the organic light emitting diode 30 in the red pixel region Rp passes through the red color filter pattern 42, only the red wavelength light passes through the red color filter pattern 42 and the other wavelength light is absorbed. When the white light from the organic light emitting diode 30 in the green pixel region Gp passes through the green color filter pattern 44, only the green wavelength light passes through the green color filter pattern 44 and the other wavelength light is absorbed. When the white light from the organic light emitting diode 30 in the blue pixel region Bp passes through the blue color filter pattern 46, only the blue wavelength light passes through the blue color filter pattern 46 and the other wavelength light is absorbed. Namely, since a specific wavelength light passes through and the other wavelength light is absorbed by the color filter patterns 42, 44 and 46, the optical efficiency is decreased.

SUMMARY OF THE INVENTION

Accordingly, embodiments of the invention are directed to a luminous body, and a light emitting film, a light emitting diode and a light emitting device including the same that substantially obviate one or more of the problems due to limitations and disadvantages of the related art, and have other advantages.

Additional features and advantages of the invention will be set forth in the description which follows, and in part will be apparent from the description, or can be learned by practice of the invention. The objectives and other advantages of the invention will be realized and attained by the structure particularly pointed out in the written description and claims hereof as well as the appended drawings.

Embodiments relate to a luminous body including a plurality of emission moieties each including an inorganic emission particle and a coating layer surrounding a surface of the inorganic emission particle; and an encapsulation moiety connected to the coating layer and surrounding the plurality of emission moieties. The present invention further provides an emitting film, a liquid crystal display device, a light emitting diode package, a light emitting diode and a light emitting display device including the luminous body.

Embodiments also relate to a light emitting film including a plurality of luminous bodies, each luminous body including: a plurality of emission moieties each including an inorganic emission particle and a coating layer surrounding a surface of the inorganic emission particle; and an encapsulation moiety connected to the coating layer and surrounding the plurality of emission moieties.

Embodiments also relate to a liquid crystal display device including a liquid crystal panel; a backlight unit under the liquid crystal panel; and an emitting film between the liquid crystal panel and the backlight unit and including a plurality of luminous bodies, wherein each luminous body includes: a plurality of emission moieties each including an inorganic emission particle and a coating layer surrounding a surface of the inorganic emission particle; and an encapsulation moiety connected to the coating layer and surrounding the plurality of emission moieties.

Embodiments also relate to a light emitting diode package including a light emitting diode chip; and an encapsulation part surrounding the light emitting diode chip and including a plurality of luminous bodies, wherein each luminous body includes: a plurality of emission moieties each including an inorganic emission particle and a coating layer surrounding a surface of the inorganic emission particle; and an encapsulation moiety connected to the coating layer and surrounding the plurality of emission moieties.

Embodiments also relate to a liquid crystal display device including a backlight unit including a light emitting diode package, wherein the light emitting diode package includes a light emitting diode chip and an encapsulation part surrounding the light emitting diode chip and including a plurality of luminous bodies; and a liquid crystal panel over the backlight unit, wherein each luminous body includes a plurality of emission moieties each including an inorganic emission particle and a coating layer surrounding a surface of the inorganic emission particle and an encapsulation moiety connected to the coating layer and surrounding the plurality of emission moieties.

Embodiments also relate to a light emitting display device including a substrate; a light emitting diode over the substrate; and a color conversion layer between the substrate and the light emitting diode or over the light emitting diode and including a plurality of luminous bodies, wherein each luminous body includes a plurality of emission moieties each including an inorganic emission particle and a coating layer surrounding a surface of the inorganic emission particle and an encapsulation moiety connected to the coating layer and surrounding the plurality of emission moieties.

Embodiments also relate to an inorganic light emitting diode including a first electrode; a second electrode facing the first electrode; and an emitting layer between the first and second electrodes and including a plurality of luminous bodies, wherein each luminous body includes a plurality of emission moieties each including an inorganic emission particle and a coating layer surrounding a surface of the inorganic emission particle and an encapsulation moiety connected to the coating layer and surrounding the plurality of emission moieties.

Embodiments also relate to an inorganic light emitting display device including a substrate; an inorganic light emitting diode including a first electrode, a second electrode facing the first electrode and an emitting layer between the first and second electrodes and including a plurality of luminous bodies; and a driving element between the substrate and the inorganic light emitting diode and connected to the inorganic light emitting diode, wherein each luminous body includes a plurality of emission moieties each including an inorganic emission particle and a coating layer surrounding a surface of the inorganic emission particle and an encapsulation moiety connected to the coating layer and surrounding the plurality of emission moieties.

It is to be understood that both the foregoing general description and the following detailed description are examples and are explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE EMBODIMENTS

Reference will now be made in detail to embodiments of the invention, examples of which are illustrated in the accompanying drawings. All the components of various display devices and their parts according to all embodiments of the present invention are operatively coupled and configured.

[Luminous Body]

Figure 1:
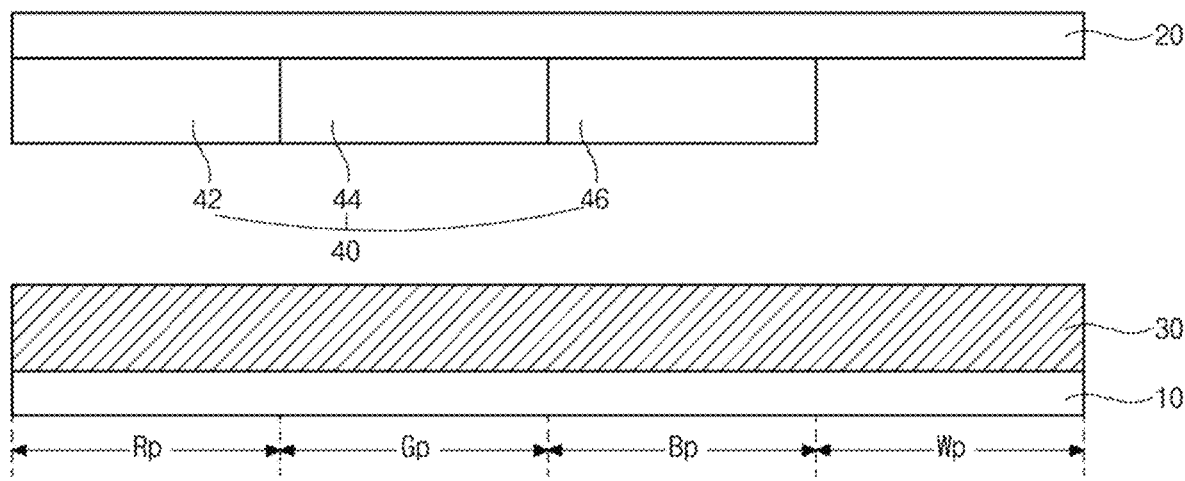
FIG. 1 is a schematic view showing a related art W-OLED display device.
Figure 2A:
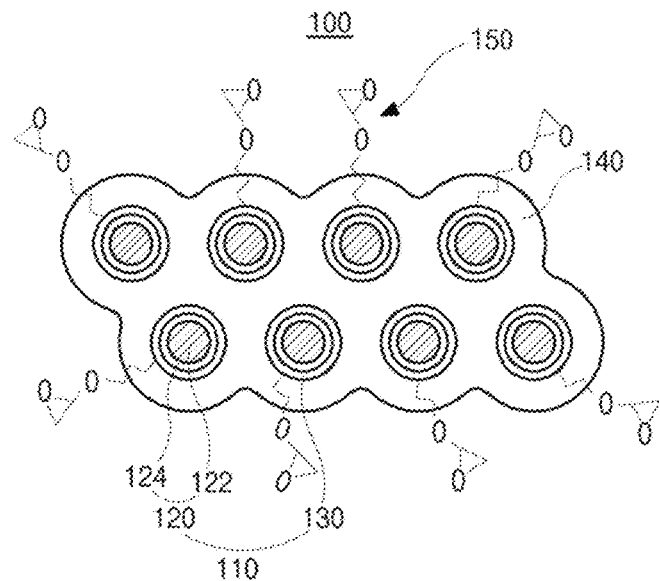
FIG. 2A is a schematic view illustrating a luminous body according to an embodiment of the present invention.

FIG. 2A is a schematic view illustrating a luminous body according to an embodiment of the present invention. As shown in FIG. 2A, a luminous body 100 of the present invention includes a plurality of emission moieties 110 and an encapsulation moiety 140 connected to the plurality of emission moieties 110 by a covalent bond and surrounding (or covering) the plurality of emission moieties 110. Each of the plurality of emission moieties 110 includes an inorganic emission particle 120 and a coating layer 130 surrounding (or covering) the inorganic emission particle 120. Optionally, the luminous body can further include a curable moiety 150 connected to a surface of the coating layer 130 by a covalent bond.

In the luminous body 100, the inorganic emission particle 120 serves as an emitter and is surrounded by the coating layer 130. For example, the inorganic emission particle 120 can be a quantum dot (QD) or a quantum rod (QR). When the inorganic emission particle 120 absorbs a first light, an electron is transited from a ground state to an excited state. The electron in the excited state is transited to the ground state such that a second light, which has a different wavelength from the first light, is emitted from the inorganic emission particle 120. On the other hand, when the luminous body 100 including the inorganic emission particle 120 is used to an emitting layer between two electrodes of an inorganic light emitting diode 800 (of FIG. 12), the inorganic emission particle 120 generates an excited exciton by a charge carrier, e.g., a hole and an electron respectively provided from the electrodes, such that the emitting layer provides a pre-determined wavelength light.

In the inorganic emission particle 120, an electron in an unstable state is transited from a conduction band to a valence band such that light is emitted. Since the inorganic emission particle 120 has a high extinction coefficient and excellent quantum yield, strong fluorescent light is emitted from the inorganic emission particle 120. In addition, since the wavelength of the light from the inorganic emission particle 120 is controlled by a size of the inorganic emission particle 120, the entire visible light can be emitted by controlling the size of the inorganic emission particle 120.

The inorganic emission particle 120 can have a single-layered structure. Alternatively, the inorganic emission particle 120 can have a heterologous structure including a core 122 at a center and a shell 124 at an outer side of the core 122. The core 122 emits the light, and the shell 124 surrounds the core 122. The shell 124 can have a single-layered structure or a multi-layered structure. Characteristics, e.g., a growth degree or a crystalline structure, of the inorganic emission particle can be controlled according to the reactivity and injection rate of precursors for the core 122 and/or shell 124, a kind of ligand and a reaction temperature to control an energy band gap of the inorganic emission particle. As a result, the wavelength of the light from the inorganic emission particle can be controlled.

For example, in a core-shell type inorganic emission particle 120 with the core 122 and the shell 124, the electron and the hole are combined in the core 122 to emit the light.

In the core-shell type inorganic emission particle 120, the wavelength of the light from the inorganic emission particle 120 can be controlled by a size of the core 122. To provide a quantum confine effect, a size of the core 122 is smaller than an exciton Bohr radius, and the core 122 has an optical band gap in corresponding size.

By the shell 124, the quantum confine effect of the core 122 is improved, and the stability of the inorganic emission particle 120 is determined. The atoms at a surface (surface atom) of a colloidal quantum dot or quantum rod of a single-layered structure have a lone pair electron different than the inner atoms. The surface atom has an energy level between the conduction band edge of the inorganic emission particle 120 and the valence band edge of the inorganic emission particle 120 such that the charges can be trapped by the surface atom. Namely, the surface defect can be generated by the surface atom. The emission efficiency of the inorganic emission particle 120 can be decreased by a non-radiative recombination process resulting from the surface defect. In addition, the trapped charges can react with external oxygen or external compound such that the deformation of the chemical composition of the inorganic emission particle 120 can be generated, and the electrical and/or optical property of the inorganic emission particle 120 can be permanently lost.

To efficiently form the shell 124 at a surface of the core 122, it is preferred that the lattice constant of a material for the shell 124 is similar to the lattice constant of a material of the core 122. Due to the shell 124 surrounding the core 122, the oxidation of the core 122 is prevented such that the chemical stability of the inorganic emission particle 120 is improved. In addition, the photo-degradation problem of the core 122 by water or oxygen is also prevented. Further, by minimizing the exciton loss resulting from a surface trap at a surface of the core 122 and preventing the energy loss resulting from a molecule vibration, the quantum efficiency of the inorganic emission particle 120 is improved.

The inorganic emission particle 120 can be a semiconductor nano-crystal or a metal oxide particle each of which providing the quantum confine effect. For example, the inorganic emission particle 120, such as the QD or the QR, can include a semiconductor nano-compound of II-VI group, III-V group, IV-VI group or group in the periodic table or a metal oxide nano-particle. Each of the core 122 and the shell 124 can include one of a II-VI group compound, e.g., CdS, CdSe, CdTe, ZnS, ZnSe, ZnTe, HgS, HgTe or their combination, a III-V group compound, e.g., GaP, GaAs, GaSb, InP, InAs, InSb or their combination, a IV-VI group compound, e.g., PbS, PbSe, PbTe or their combination, group compound, e.g., $AgGaS_2$, $AgGaSe_2$, $AgGaTe_2$, $AgInS_2$, $CuInS_2$, $CuInSe_2$, $CuGaS_2$, $CuGaSe_2$ or their combination, and a metal oxide compound, e.g., ZnO, $TiO_2$ or their combination. The semiconductor nano-crystal can be doped with a rare-earth element, e.g., Eu, Er, Tb, Tm, Dy or their combination or a transition metal, e.g., Mn, Cu, Ag, Al or their combination. Alternatively, the semiconductor nano-crystal cannot be doped.

For example, the core 122 of the inorganic emission particle 120 can be formed of a material selected from the group consisting of InP, InZnP, InGaP, CdSe, CdSeS, CdTe, CdS, PbS, PbSe, ZnSe, ZnTe, CdSe, ZnCdS, $Cu_xIn_{1-x}S$, $Cu_xIn_{1-x}Se$, $Ag_xIn_{1-x}S$ and their combination. The shell 124 of the inorganic emission particle 120 can be formed of a material selected from the group consisting of ZnSe, CdS, CdSeS, ZnSeS, ZnS, PbS, GaP, ZnTe, CdS/ZnS, ZnSe/ZnS, ZnS/ZnSe/CdSe, GaP/ZnS, CdS/CdZnS/ZnS, ZnS/CdSZnS, $Cd_xZn_{1-x}S$ and their combination.

The inorganic emission particle 120 can be an alloy QD such as a homogeneous alloy QD or a gradient alloy QD. The alloy QD can be formed of $CdS_xSe_{1-x}$, $CdSe_xTe_{1-x}$, $Zn_xCd_{1-x}Se$. ($1 \geq x \geq 0$)

The coating layer 130 covers an outer surface of the inorganic emission particle 120. For example, the coating layer 130 can cover the shell 124. The coating layer 130 can include a material selected from the group consisting of $SiO_2$, $TiO_2$, $Al_2O_3$, $ZrO_2$, ZnO, niobium, zirconium, cerium and silicate, but it is not limited thereto. In addition, a surface of the material for the coating layer 130 can be modified by a silanol group or a hydroxyl group. When the material for the coating layer 130 is modified by a hydroxyl group, a covalent bond between the inorganic emission particle 120 and at least one of the encapsulation moiety 140 and the curable moiety 150 is easily or effectively formed.

The coating layer 130 can have a porous property being one of a microporous property, a mesoporous property and a macroporous property. The microporous property means that an average diameter of the pore in the porous coating layer is less than 2 nm. The mesoporous property means that an average diameter of the pore in the porous coating layer is equal to or larger than 2 nm and less than 50 nm. The macroporous property means that an average diameter of the pore in the porous coating layer is equal to or larger than 50 nm. For example, the coating layer 130 can be mesoporous coating layer, but it is not limited thereto.

The porous coating layer can be formed by adding precursors and a porous-forming agent for the porous coating layer using one of a coprecipitation method, a hydrothermal synthesis method, a self-assembly method, a molding method, an anodic oxidation method, an electrochemical etching method, a sol-gel process and a coordination chemistry method to cover or surround the surface of the inorganic emission particle 120.

For example, when silica precursor (e.g., tetraethoxy ortho-silicate, TEOS) is added into a solution, where an inorganic emission particle and a porous-forming agent, alkoxysilane is hydrolyzed such that silica oligomer is formed and a primary particle having silica/porous-forming agent structure is formed. Then, the primary particles are aggregated to grow the mesopore. As a result, the inorganic emission particle with a porous silica coating layer is obtained.

The encapsulation moiety 140 of the luminous body 100 is connected to or combined with the plurality of emission moieties 110 by a covalent bond and surrounds or covers the plurality of emission moieties 110. For example, the encapsulation moiety 140 can be formed of a silicone-based material. The silicone-based material for the encapsulation moiety 140 can be a silane-based material or a siloxane-based material each having at least one alkoxy group. The silane-based material or the siloxane-based material can have a linear silane/siloxane group, a cyclo-silane/siloxane group or a tetrahedron silane/siloxane group. The silane-based material and the siloxane-based material have a high heat-resisting property. When the siloxane-based material having the cyclo-siloxane group or the tetrahedron siloxane group is used for the encapsulation moiety 140, the heat-resisting property of the luminous body 100 is further improved.

The silane-based material or the siloxane-based material having the linear silane/siloxane group can include at least one C1~C20 alkoxy group. Optionally, the silane-based material or the siloxane-based material having the linear silane/siloxane group can be substituted by a C1~C20 alkyl group. Namely, the silane-based material or the siloxane-based material having the linear silane/siloxane group can be alkoxysilane/alkoxysiloxane or alkoxyalkylsilane/alkoxyalkylsiloxane. The silane-based material having the linear silane group can be trimethylmethoxysilane, trimethylethoxysilane, triethylethoxysilane, trimethylpropoxysilane, triethylpropoxysilane, trimethylbutoxysilane, triethylbutoxysilane, dimethylmethoxysilane, dimethyldiethoxysilane, diethylethoxysilane, dimethyldipropoxysilane, diethyldipropoxysilane, dimethyldibutoxysilane, diethyldibutoxysilane, trimethoxymethylsilane, triethoxyethylsilane, triethoxyethylsilane, trimethoxypropylsilane, triethoxypropylsilane, trimethoxybutylsilane, triethoxybutylsilane, or their combination, but it is not limited thereto.

The siloxane-based material having the cyclo-siloxane group can be substituted by a C1~C20 alkyl group, beneficially, a C1~C10 alkyl group, e.g., methyl or ethyl. The siloxane-based material having the cyclo-siloxane group can be methylhydrocyclosiloxane, hexa-methylcyclotrisiloxane, hexa-ethylcyclotrisiloxane, tetra-, penta-, hexa- or octa-methylcyclotetrasiloxane, tetra-, penta-, hexa-, octa-, deca-methylcyclopentasiloxane, tetra-, penta-, hexa-, octa-, dodeca-methylcyclohexasiloxane, tetradeca-methylcycloheptasiloxane, hexadeca-methylcyclooctasiloxane, teraphenyl cyclotetrasiloxane or their combination.

The silane-based material having the tetrahedron siloxane group can be tetrakisdimethylsiloxysilane, tetrakisdiphenylsiloxysilane, tetrakisdiethylsiloxysilane or their combination.

As mentioned above, the encapsulation moiety 140 is connected to or combined with the plurality of emission moieties 110 by a covalent bond and surrounds or covers the plurality of emission moieties 110. For example, a condensation reaction between the silane-based material or the siloxane-based material for the encapsulation moiety 140 and the hydroxyl group existing on a surface of the coating layer 130 of the emission moiety 110 is generated such that the encapsulation moiety 140 is connected to or combined with the plurality of emission moieties 110 by a covalent bond, e.g., a siloxane bond.

As mentioned above, the encapsulation moiety 140 is connected to or combined with the plurality of emission moieties 110 by a covalent bond such that the plurality of emission moieties 110 are aggregated in a single encapsulation moiety 140. Accordingly, the density of the inorganic emission particle 120 in the encapsulation moiety 140 is increased, and an emission efficiency of a film or a device using the luminous body 100 is maximized. Adjacent emission moieties 110 in the encapsulation moiety 140 can have a uniform distance. In addition, when the encapsulation moiety 140 is formed of the silane-based material or the siloxane-based material, the heat-resisting property of the luminous body 100 is improved because the encapsulation moiety 140 surrounds the plurality of emission moieties 110.

As mentioned above, the luminous body 100 can further include the curable moiety 150. The curable moiety 150 can be connected to an outer surface of each emission moiety 110, i.e., the coating layer 130, by the covalent bond. When a film or a layer is formed using the luminous body 100, the film or the layer can be stably formed because a cross-linking bond is generated by the curable moiety 150.

The curable moiety 150 can be a monomer or an oligomer being capable of forming a siloxane resin through the cross-linking combination by curing. The curable moiety 150 can include a curable functional group for being cured into the siloxane resin. The curable functional group can be a functional group having an ethylene double bond, e.g., acrylate group, metacrylate group or a vinyl group, a functional group having an epoxy ring, e.g., epoxy group or glycidoxy group, a hydroxyl group, a halogen group, an amine group, an amino group, a nitro group, an amide group, a mercapto group or a cyano group. The siloxane monomer or the siloxane oligomer can include at least one curable functional group. The curable functional group can be substituted at an end of the siloxane oligomer.

Optionally, the curable functional group in the siloxane monomer or the siloxane oligomer can have the cross-linking reaction with a functional group of a cross-linking agent to form the siloxane resin. For example, the vinyl group, which is substituted at the siloxane monomer or the siloxane oligomer, can have the cross-linking reaction with a reactive functional group, e.g., a silane group (Si—H) or a silanol group (Si—OH), in the cross-linking agent.

The reactive functional group in the cross-linking agent can be a hydroxyl group, C2~C20 alkenyl group, C1~C10 alkoxy group, C1~C20 alkylamino group, C6~C20 benzamino group, C2~C20 alkenyloxy group, C6~C20 aryloxy group, halogen atom or hydrogen (H), but it is not limited thereto. The silanol group is formed by the hydroxyl group, and the silane group is formed by the others. At least one functional group can be substituted to polysiloxane-based compound or organic silane compound for the cross-linking agent. For example, the cross-linking agent can be siloxane polymer having a silsesquioxane structure. In this instance, the silsesquioxane structure can be a ladder shape or a case shape.

When the siloxane monomer and/or the siloxane oligomer with the curable functional group is reacted with the cross-linking agent to form the siloxane resin, a weight % ratio of the siloxane monomer and/or the siloxane oligomer to the cross-linking agent can be 2:1 to 20:1, preferably, 3:1 to 10:1. To activate the reaction between the siloxane monomer and/or the siloxane oligomer and the cross-linking agent, a catalyst can be added. For example, the catalyst can be a metal, e.g., Pt, Ru, Ir, Rh, Pd or Sn, or an organic compound of the metal. The catalyst can have a part by weight % of about 0.01 to 10 with respect to the siloxane monomer and/or the siloxane oligomer.

The siloxane monomer and/or the siloxane oligomer can include at least one silanol group and/or siloxane group.

A monomer and/or oligomer having a siloxane group can be used as a material having the curable functional group for forming the siloxane resin. The monomer and/or oligomer having the siloxane group can be linear siloxane-based monomer/oligomer, cyclo-siloxane-based monomer/oligomer or tetrahedral siloxane-based monomer/oligomer.

The linear siloxane-based monomer/oligomer can be alkylsiloxane with C1-C10 alkyl substituent and/or C1-C10 alkoxy substituent, alkoxysiloxane with C1-C10 alkyl substituent and/or C1-C10 alkoxy substituent, alkoxyalkylsiloxane with C1-C10 alkyl substituent and/or C1-C10 alkoxy substituent, vinylalkoxysiloxane with C1-C10 alkyl substituent and/or C1-C10 alkoxy substituent.

The siloxane group as the repeat unit of the cyclo-siloxane-based monomer/oligomer can be substituted by C1~C20 alkyl group, preferably C1~C10 alkyl such as methyl or ethyl. Polyalkyl cyclo siloxane resin having the repeat unit of cyclo siloxane group can include cyclo-siloxane-based resin such as polydialkylsiloxane, e.g., polydimethylsiloxane. The cyclo-siloxane-based resin can be those for the encapsulation moiety 140. The monomer having tetrahedral siloxane group can be tetrakisdimethylsiloxysilane, tetrakisdiphenylsiloxysilane, tetrakisdiethylsiloxysilane or their combination.

The related art inorganic emission particle, such as the QD or the QR, is used for the light emitting display device, the inorganic emission particle should be dispersed in the non-polar solvent because of their chemical property. However, there is a limitation in the dispersion property such that the density of the inorganic emission particle in a unit area is limited. As a result, there is a limitation in the emission property (e.g., brightness).

In addition, when one inorganic emission particle (donor inorganic emission particle) and the other inorganic emission particle (acceptor inorganic emission particle) are closely arranged within a distance, the light from the donor inorganic emission particle is absorbed by the acceptor inorganic emission particle. Namely, the acceptor inorganic emission particle is excited by the energy of the light from the donor inorganic emission particle such that the fluorescent emission is induced in the acceptor inorganic emission particle. It can be referred to as a Fluorescence Resonance Energy Transfer (or Forster Resonance Energy Transfer; FRET). As a result, the quantum efficiency and/or the emission efficiency of the related art inorganic emission particle is decreased.

However, in the embodiments of the present invention, the emission moiety 110 as the emitter includes the coating layer 130 surrounding the surface of the inorganic emission particle 120. Accordingly, the plurality of emission moieties 110 in the encapsulation moiety 140 have a sufficient distance due to the coating layer 130. Namely, since the coating layer 130 surrounds the inorganic emission particle 120, adjacent inorganic emission particles 120 have a distance to sufficiently avoid the FRET. In other words, the emission moiety 110 includes the coating layer 130 having a thickness (e.g., about 50 to 300 nm), the near arrangement of adjacent inorganic emission particle 120 is prevented. Accordingly, the decrease of the quantum efficiency and/or the emission efficiency of the inorganic emission particle 120 is prevented.

In addition, the luminous body 100 includes the encapsulation moiety 140 connected to the emission moiety 110 by the covalent bond, e.g., the silica bond. The plurality of the emission moieties 110 are surrounded by the encapsulation moiety 140 such that the density of the emission moiety 110 is increased with a pre-determined distance. Accordingly, the emission property and the emission efficiency of the luminous body 100 are improved.

Further, the luminous body 100 includes the curable moiety 150 connected to the emission moiety 110 by the covalent bond. When a film or a layer is formed using the luminous body 100, the film or the layer can be stably formed because a cross-linking bond is generated by the curable moiety 150.

Moreover, since the encapsulation moiety 140 and/or the curable moiety 150, which surrounds the emission moiety 110, is formed by the siloxane polymer having high heat-resisting property, the heat-resisting property of the luminous body 100 is also improved.

Figure 2B:
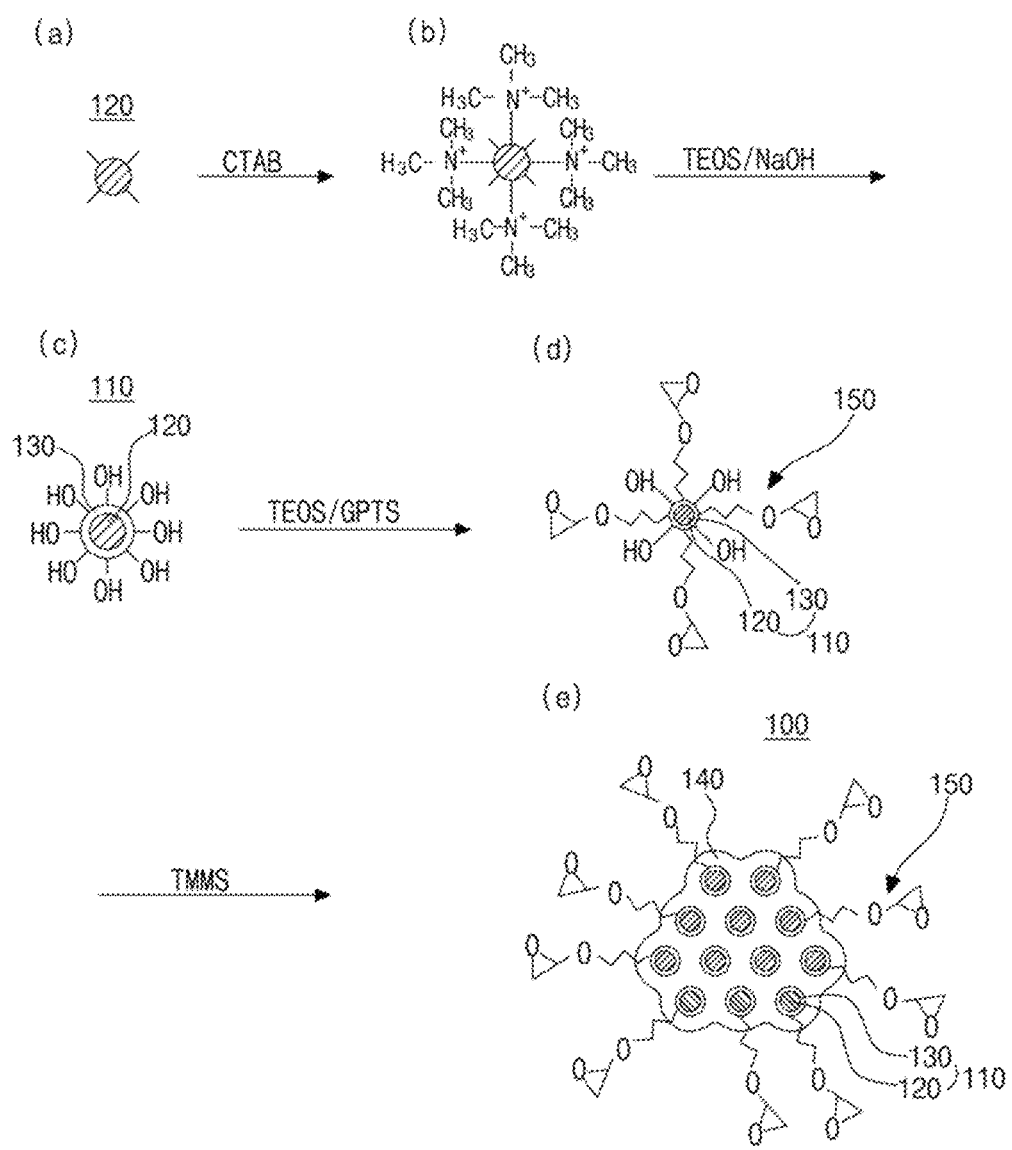
FIG. 2B is a schematic view illustrating a synthesis of the luminous body according to the embodiment of the present invention.

FIG. 2B is a schematic view illustrating a synthesis of the luminous body. In the luminous body 100 synthesized by FIG. 2B, the coating layer 130 is formed of silica, and each of the encapsulation moiety 140 and the curable moiety 150 is formed of silane-based material.

As shown in (a) of FIG. 2B, an inorganic emission particle 120 is prepared. The inorganic emission particle 120 is reacted with cetyltrimethylammonium bromide (CTAB) to grow a ligand at a surface of the inorganic emission particle 120 as shown in (b) of FIG. 2B. In this instance, to activate the growth of the ligand, a cationic surfactant, e.g., alkyl ammonium salt, alkylpyridinium salt, alkylimidazolinium salt, quaternary ammonium salt and/or primary to tertiary amine salt, can be used. On the other hand, with or instead of CTAB, tetradecylmethylammonium bromide (TTAB), cetylmethylammonium chloride (CTAC), hexadecyltrimethylammonium bromide (HTAB), N-dodecyl pyridinium chloride and/or benzalkonium chloride (or alkyldimethyl benzylammonium chloride) can be used to grow the ligand.

Next, the inorganic emission particle having the ligand is reacted with tetraethyl orthosilicate (TEOS) as a precursor for the silica coating and NaOH for modifying a surface of the coating layer by hydroxyl group. As a result, as shown in (c) of FIG. 2B, the silica coating layer 130 including the hydroxyl group at its surface is grown on an outer surface of the inorganic emission particle 120 to form the emission moiety 110.

Next, (3-glycidyloxyproptyl)trimethyoxysilane (GPTS), which has the curable functional group for generating the covalent bond with a surface of the silica coating layer, with TEOS is added. As a result, as shown in (d) of FIG. 2B, the curable moiety 150 is grown at the surface of the silica coating layer 130. Other siloxane-based material having a curable functional group can be used instead of GPTS.

Next, trimethoxymethylsilane (TMMS) is added such that silicon in TMMS is combined with the hydroxyl group at the surface of the silica coating layer 130 by the spontaneous condensation reaction. As a result, as shown in (e) of FIG. 2B, the encapsulation moiety 140 is grown to surround the plurality of emission moieties 110. Namely, the luminous body 100 including the plurality of emission moieties 110 inside single encapsulation moiety 140 is provided. Other silane-based material or siloxane-based material can be used instead of TMMS to grow the encapsulation moiety 140.

[Light Emitting Film, LED Package and LCD Device]

As mentioned above, using the luminous body 100 of the present invention, the density of the inorganic emission particle 120 is increased, and the FRET problem is prevented. In addition, the heat-resisting property of the luminous body 100 is improved. The luminous body 100 is applicable to an emitting unit, e.g., a light emitting film, an LED package and a display device.

Figure 3:
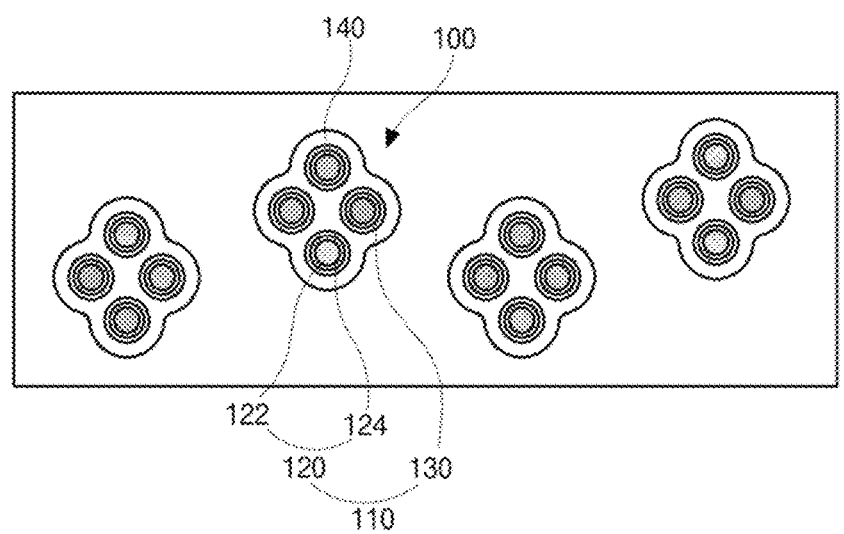
FIG. 3 is a schematic view illustrating an example of a light emitting film according to an embodiment of the present invention.

FIG. 3 is a schematic view illustrating a light emitting film 200 according to an embodiment of the present invention. As shown in FIG. 3, the light emitting film 200 includes the luminous body 100 including the plurality of emission moieties 110 and the encapsulation moiety 140 connected to the plurality of emission moieties 110 by a covalent bond and surrounding the plurality of emission moieties 110. The luminous body 100 can further include the curable moiety 150 (of FIG. 2A) connected to the emission moiety 110. The emission moiety 110 includes the inorganic emission particle 120 and the coating layer 130 surrounding the inorganic emission particle 120. The inorganic emission particle 120 can include the core 122 and the shell 124. The encapsulation moiety 140 can be formed of a silane-based material or a siloxane-based material. A distance between adjacent emission moieties 110 in one encapsulation moiety 140 can be smaller than a distance between adjacent emission moieties 110 in different encapsulation moieties 140.

Due to the curable moiety 150, the luminous bodies 100 can form the light emitting film 200 without a binder such that the density of the luminous body 100 in the light emitting film 200 is increased.

The luminous body 100 can emit various color lights by controlling a size of the core 122 and a material of the core, and the shell 124 protects the core 122 to decrease a trap energy level.

Since the coating layer 130 covers or surrounds the surface of the inorganic emission particle 120, the FRET problem, which can be caused between adjacent inorganic emission particles, is prevented or minimized. In addition, due to the encapsulation moiety 140 and/or the curable moiety 150, which can be formed of silane-based material or siloxane-based material, the heating-resisting property and the structural stability of the light emitting film 200 including the luminous body 100 are improved.

Figure 4:
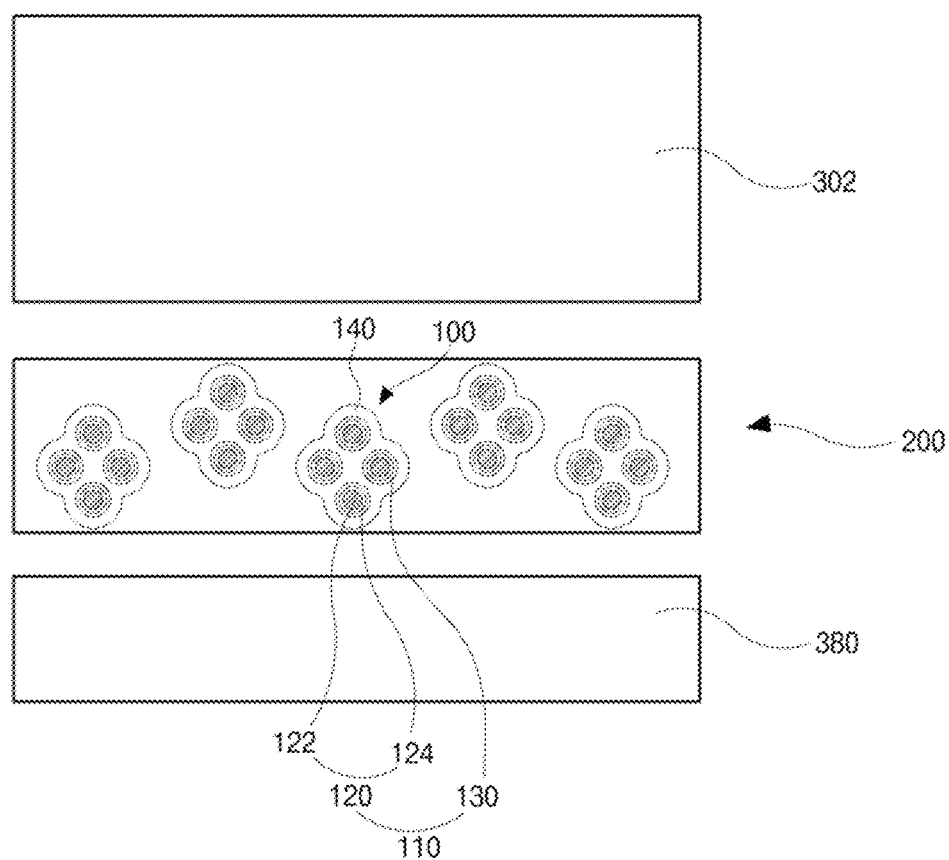
FIG. 4 is a schematic view illustrating a liquid crystal display (LCD) device according to an embodiment of the present invention.
Figure 5:
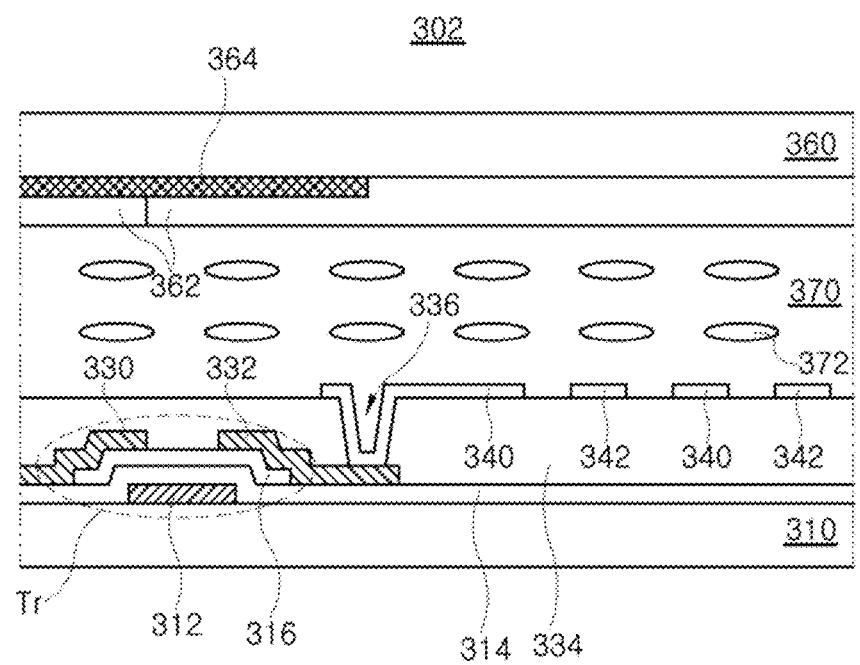
FIG. 5 is a schematic cross-sectional view of an example of a liquid crystal panel of FIG. 4.

FIG. 4 is a schematic view illustrating a liquid crystal display (LCD) device according to an embodiment of the present invention, and FIG. 5 is a schematic cross-sectional view of a liquid crystal panel of FIG. 4 as an example.

As shown in FIG. 4, an LCD device 300 includes a liquid crystal panel 302, a backlight unit 380 under the liquid crystal panel 302 and the light emitting film 200 between the liquid crystal panel 302 and the backlight unit 380.

Referring to FIG. 5, the liquid crystal panel 302 includes first and second substrates 310 and 360 facing each other and a liquid crystal layer 370 including liquid crystal molecules 372 and disposed between the first and second substrates 310 and 360.

A gate electrode 312 is formed on the first substrate 310, and a gate insulating layer 314 is formed to cover the gate electrode 312. In addition, a gate line being connected to the gate electrode 312 is formed on the first substrate 310. The gate insulating layer 314 can be formed of an inorganic insulating material such as silicon oxide or silicon nitride.

A semiconductor layer 316 corresponding to the gate electrode 312 is formed on the gate insulating layer 314. The semiconductor layer 316 includes an oxide semiconductor material. Alternatively, the semiconductor layer 316 can include an active layer of intrinsic amorphous silicon and an ohmic contact layer of impurity-doped amorphous silicon.

A source electrode 330 and a drain electrode 332 are formed on the semiconductor layer 316 to be spaced apart from each other. In addition, a data line, which is connected to the source electrode 330 and crosses the gate line to define a pixel region, is formed on the gate insulating layer 314.

The gate electrode 312, the semiconductor layer 316, the source electrode 330 and the drain electrode 332 constitute a thin film transistor (TFT) Tr.

A passivation layer 334, which includes a drain contact hole 336 exposing the drain electrode 332, is formed on the TFT Tr. The passivation layer 334 can be formed of an inorganic insulating material, e.g., silicon oxide or silicon nitride, or an organic insulating material, e.g., benzocyclobutene or photo-acryl.

A pixel electrode 340, which is connected to the drain electrode 332 through the drain contact hole 336, and a common electrode 342, which is alternately arranged with the pixel electrode 340, are formed on the passivation layer 334.

A black matrix 364, shielding a non-display region, e.g., the TFT Tr, the gate line and the data line, is formed on the second substrate 360, and a color filter layer 362 corresponding to the pixel region is formed on the second substrate 360.

The first and second substrate 310 and 360 are attached with the liquid crystal layer 370 therebetween. The liquid crystal molecules 372 of the liquid crystal layer 370 are driven by an electric field between the pixel and common electrodes 340 and 342. Although not shown, first and second alignment layers are formed over the first and second substrates 310 and 360 to be adjacent to the liquid crystal layer 370. In addition, first and second polarization plates, which have perpendicular transmission axes, are disposed at an outer side of the first and second substrates 310 and 360.

Referring again to FIG. 4, the backlight unit 380 includes a light source and provides the light toward the liquid crystal panel 302. The backlight unit 380 can be classified into a direct type and a side type according to a position of the light source.

For example, the direct type backlight unit 380 can include a bottom frame covering a rear side of the liquid crystal panel 302, and a plurality of light sources can be arranged on a horizontal bottom surface of the bottom frame. The side type backlight unit 380 can include a bottom frame covering a rear side of the liquid crystal panel 302 and a light guide plate on or over a horizontal bottom surface of the bottom frame. The light source can be arranged at a side of the light guide plate. The light source can emit blue light. For example, the blue light can have a wavelength range of about 430 to 470 nm.

The light emitting film 200 is positioned between the liquid crystal panel 302 and the backlight unit 380, the color purity of the light, which is provided from the backlight unit 380 toward the liquid crystal panel 302, is improved by the light emitting film 200. The luminous body 100 of the light emitting film 200 includes the plurality of emission moieties 110, each of which includes the inorganic emission particle 120 and the coating layer 130 surrounding the inorganic emission particle 120, and the encapsulation moiety 140 connected to the plurality of emission moieties 110 by a covalent bond and surrounding the plurality of emission moieties 110. The luminous body 100 can further include the curable moiety 150 (of FIG. 2A) connected to the emission moiety 110.

Figure 6:
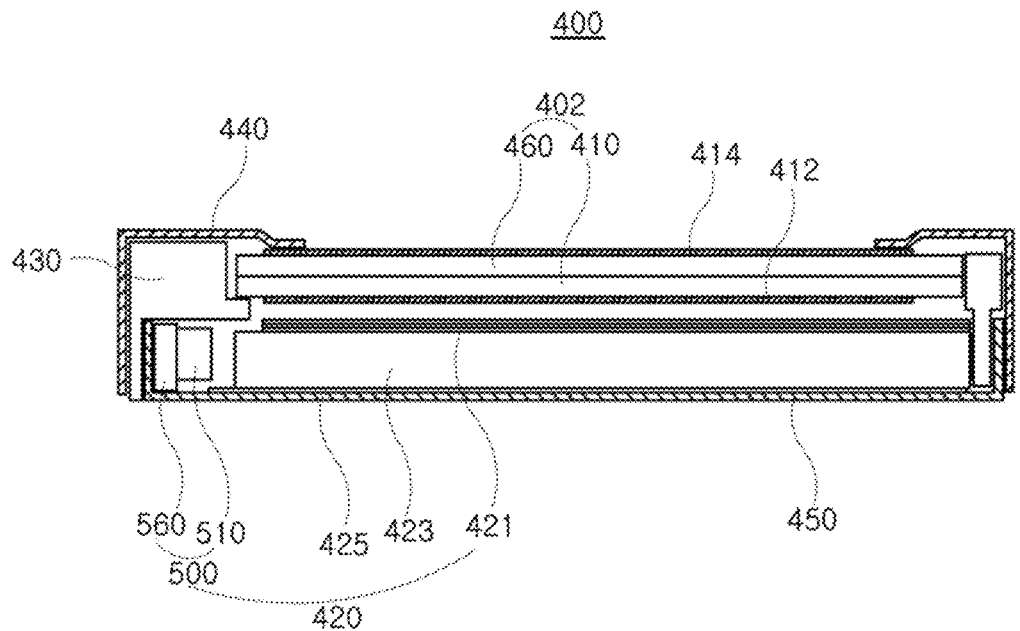
FIG. 6 is a schematic cross-sectional view illustrating a display device according to an embodiment of the present invention.
Figure 7:
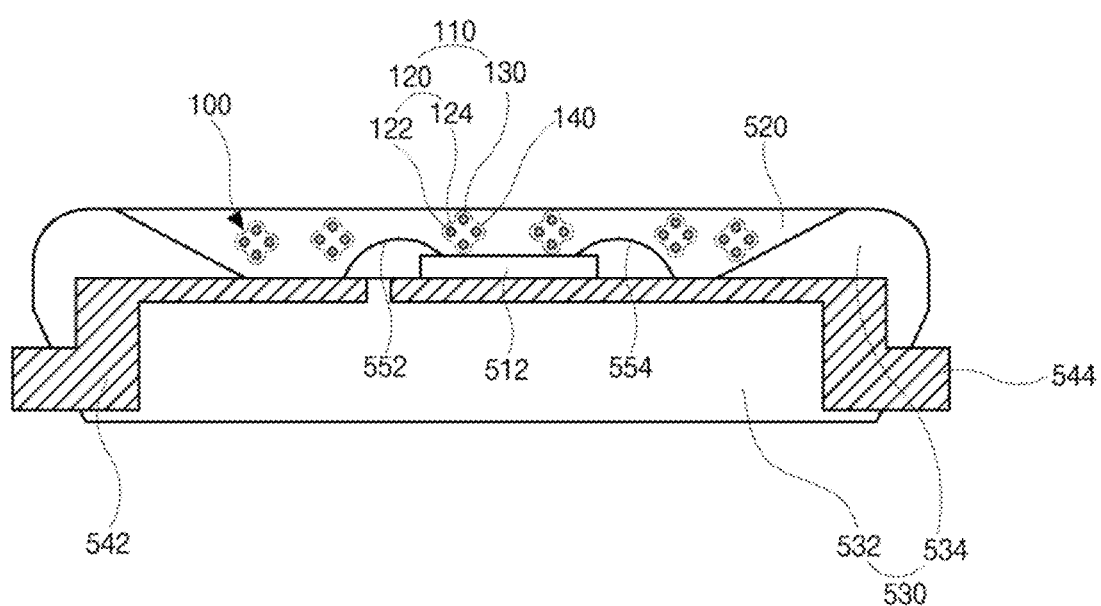
FIG. 7 is a schematic cross-sectional view illustrating an LED package according to an embodiment of the present disclosure.

FIG. 6 is a schematic cross-sectional view illustrating a display device according to an embodiment of the present invention, and FIG. 7 is a schematic cross-sectional view illustrating an LED package according to an embodiment of the present disclosure.

As shown in FIG. 6, an LCD device 400 includes a liquid crystal panel 402 as a display panel, a backlight unit 420 under the liquid crystal panel 402. The LCD device 400 can further include a main frame 430, a top frame 440 and a bottom frame 450 for modularizing the liquid crystal panel 402 and the backlight unit 420. The liquid crystal panel 402 includes first and second substrates 410 and 460 and a liquid crystal layer 370 (of FIG. 5) therebetween. Since the liquid crystal panel 402 can have similar structure as those in FIG. 5, the explanation is omitted. First and second polarization plates 412 and 414 transmitting a pre-determined light are attached on an outer surface of the first and second substrates 410 and 460, respectively. A linearly-polarized light being parallel to a direction of a transmissive axis of the first and second polarization plates 412 and 414 passes through the first and second polarization plates 412 and 414. For example, the transmissive axis of the first and second polarization plates 412 and 414 can be perpendicular to each other.

A printed circuit board (PCB) can be connected to at least one side of the liquid crystal panel 402 via a connection member, for example, a flexible PCB or a tape carrier package. The PCB is bent along a side surface of the main frame 430 or a rear surface of the bottom frame 450 during a modularization process of the LCD device 400.

The backlight unit 420 providing the light is disposed under the liquid crystal panel 402. The backlight unit 420 includes a light emitting diode (LED) assembly 500, a reflective plate 425 of white or silver, a light guide plate 423 on the reflective plate 425 and an optical sheet 421 on the light guide plate 423.

The LED assembly 500 is disposed at a side of the light guide plate 423 and includes a plurality of LED packages 510 and an LED PCB 560. The LED packages 510 are arranged on the LED PCB 560. Each LED package 510 can an LED chip 512 (of FIG. 7) emitting red, green and blue lights or white light such that white light is provided from the LED package 510 toward the light guide plate 423. For example, adjacent three LED packages 510 respectively emit red, green and blue lights, and the lights are mixed to provide the white light. The LED PCB 560 can be a flexible PCB or a metal core PCB.

The light from the LED package 510 is incident into the light guide plate 423. The light travels through the light guide plate 423, and a plane light source is provided onto the liquid crystal panel 402 by a total reflection in the light guide plate 423.

Patterns for providing uniform plane light can be formed on a rear surface of the light guide plate 423. For example, the patterns of the light guide plate 423 can be an elliptical pattern, a polygonal pattern or a hologram pattern.

The reflective plate 425 is disposed under the light guide plate 423, and the light from the rear side of the light guide plate 423 is reflected by the reflective plate 425 to improve the brightness. The optical sheet 421 on or over the light guide plate 423 can include a light diffusion sheet or at least one light concentration sheet.

The LED packages 510 can be arranged in a plurality of lines on the LED PCB 560.

The liquid crystal panel 402 and the backlight unit 420 are modularized by the main frame 430, the top frame 440 and the bottom frame 450. The top frame 440 covers edges of a front surface of the liquid crystal panel 402 and side surfaces of the liquid crystal panel 402. The top frame 440 has an opening such that images from the liquid crystal panel 402 can be displayed through the opening of the top frame 440. The bottom frame 450 includes a bottom surface and four side surfaces to cover a rear surface of the backlight unit 420 and side surfaces of the backlight unit 420. The bottom frame 450 covers a rear side of the backlight unit 420. The main frame 430 has a rectangular frame shape. The main frame 430 covers side surfaces of the liquid crystal panel 402 and the backlight unit 420 and is combined with the top frame 440 and the bottom frame 450.

Referring to FIG. 7, the LED package 510 includes an LED chip 512 and an encapsulation part 520 covering the LED chip 512, and the encapsulation part 520 includes the luminous body 100. The luminous body 100 includes the emission moiety 110 and the encapsulation moiety 140, and optionally further includes the curable moiety 150 (of FIG. 2A).

The LED package 510 can be a white LED package. For example, the LED chip 512 emits UV ray, and the luminous bodies 100 respectively emitting the red light, the green light and the blue light are included in the encapsulation part 520. Alternatively, the LED chip 512 emits the blue light, and the luminous body 100 absorbing the blue light and emitting yellow light or the luminous bodies 100 absorbing the blue light and emitting red light and green light are included in the encapsulation part 520.

For example, when the LED chip 512 is a blue LED chip emitting light having a wavelength about 430 to 470 nm, the inorganic emission particle 120 of the luminous body 100 can be the QD or the QR emitting the green light and/or the red light. The blue LED chip 512 can include an exciting light source having blue peak wavelength on a sapphire substrate. The exciting light source can be formed of GaN, InGaN, InGaN/GaN, $BaMgAl_{10}O_7:Eu^{2+}$, $CaMgSi_2O_6:Eu^{2+}$ or their combination, but it is not limited thereto.

In this instance, the inorganic emission particle 120 absorbs the blue light from the blue LED chip and emits a pre-determined wavelength light. The inorganic emission particle 120 covers an entire of the blue LED chip such that the white LED package 510 is provided.

The LED package 510 further includes a case 530 and first and second electrode leads 542 and 544, which are respectively connected to the LED chip 512 via first and second wires 552 and 554 and extend into an outside of the case 530. The case 530 includes a body 532 and a side wall 534 protruding from an upper surface of the body 532 and serving as a reflection surface. The LED chip 512 is arranged on the body 532 and is surrounded by the side wall 534.

As mentioned above, by varying the composition and the structure of the inorganic emission particle 120, the wavelength of the light from the luminous body 100 can be controlled. For example, when the inorganic emission particle 120 has a structure of the core 122 and the shell 124, the quantum efficiency of the inorganic emission particle 120 is improved and the photo degradation problem is prevented. In addition, since the coating layer 130 covers or surrounds the surface of the inorganic emission particle 120, the FRET problem, which can be caused between adjacent inorganic emission particles, is prevented or minimized. Further, since the plurality of emission moieties 110 are included in single encapsulation moiety 140, the density of the inorganic emission particle 120 is increased. Accordingly, even if a thickness of the encapsulation part 520 is smaller than a thickness of the encapsulation part of the related art LED package, the LED package 510 provides sufficient emission efficiency. Moreover, due to the encapsulation moiety 140 and/or the curable moiety 150, which can be formed of silane-based material or siloxane-based material, the heating-resisting property of the luminous body 100 are improved. Accordingly, a thermal damage on the luminous body 100 by a heat from the LED chip 512 is minimized or prevented such that the emission property of the LED package 510 can be maintained. Namely, the brightness of the LED package 510 including the luminous body 100 and the LCD device 400 including the LED package 510 is improved.

[Light Emitting Display Device Including Color Conversion Layer]

Figure 8:
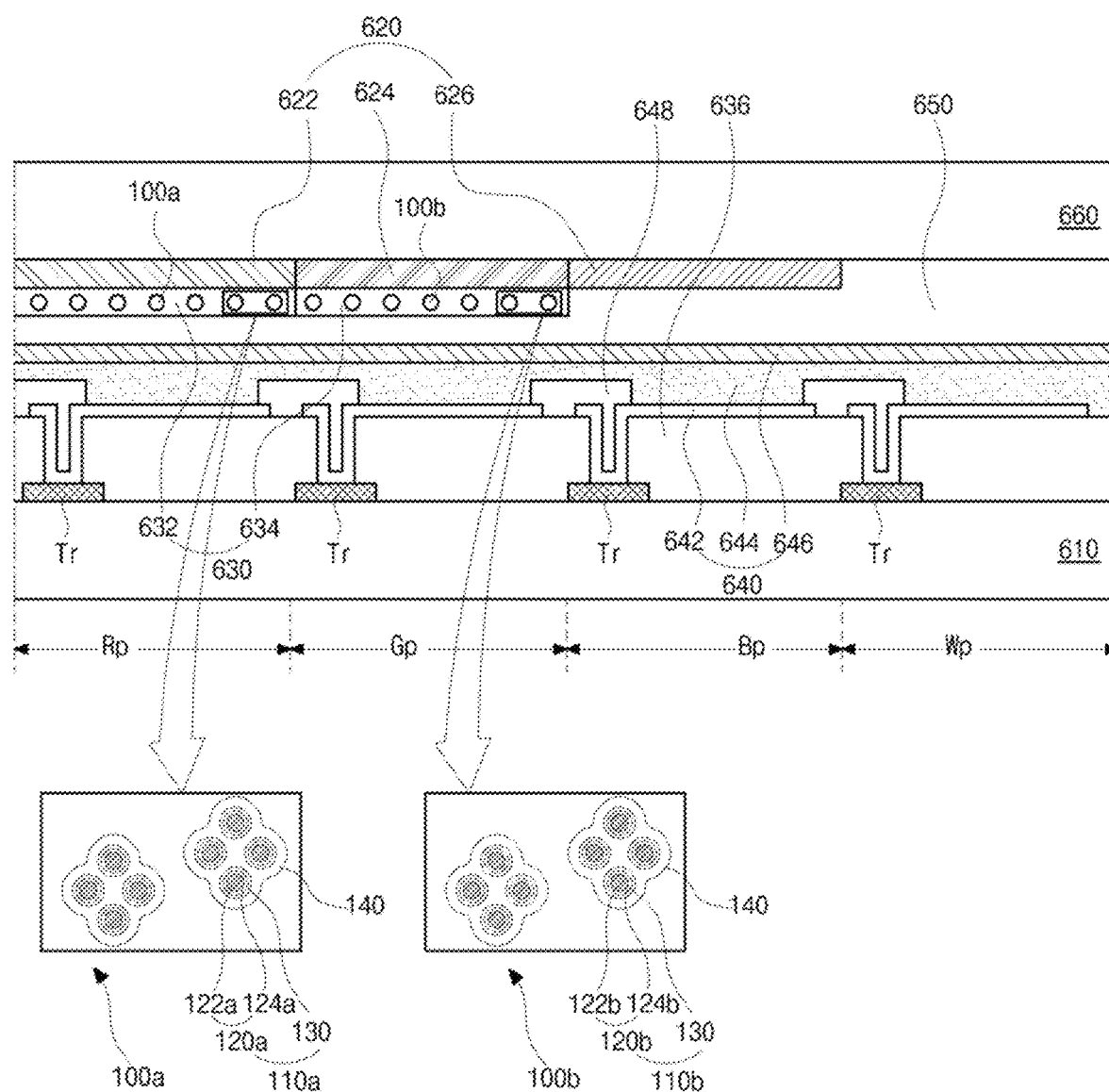
FIG. 8 is a schematic cross-sectional view illustrating a top-emission type light emitting diode display device according to an embodiment of the present invention.

Since the luminous body 100 has excellent emission property and heat-resisting property, the luminous body 100 can be used for a color conversion layer of a light emitting display device. FIG. 8 is a schematic cross-sectional view illustrating a top-emission type light emitting diode display device according to an embodiment of the present invention, and FIGS. 9A to 9C are schematic cross-sectional views illustrating a top-emission type W-OLED display device according to an embodiment of the present invention, respectively.

Figure 9A:
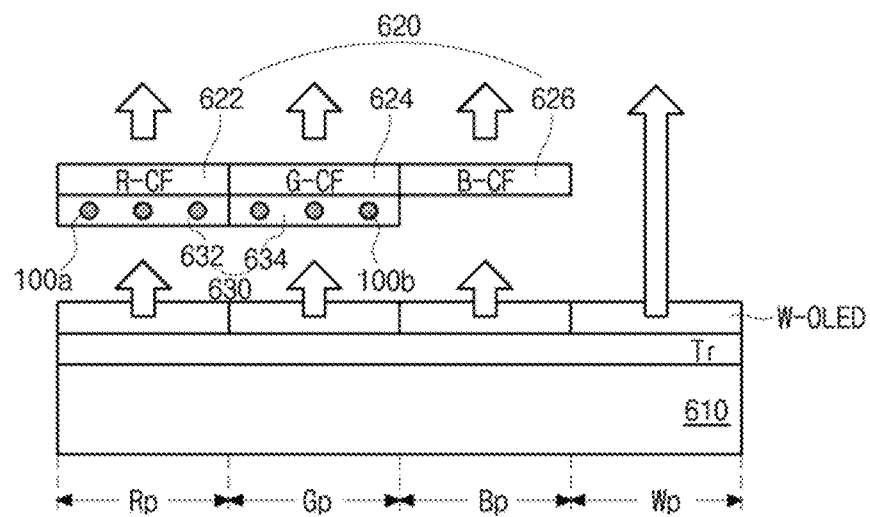
FIGS. 9A to 9C are schematic cross-sectional views illustrating a top-emission type W-OLED display device according to an embodiment of the present invention, respectively.
Figure 9B:
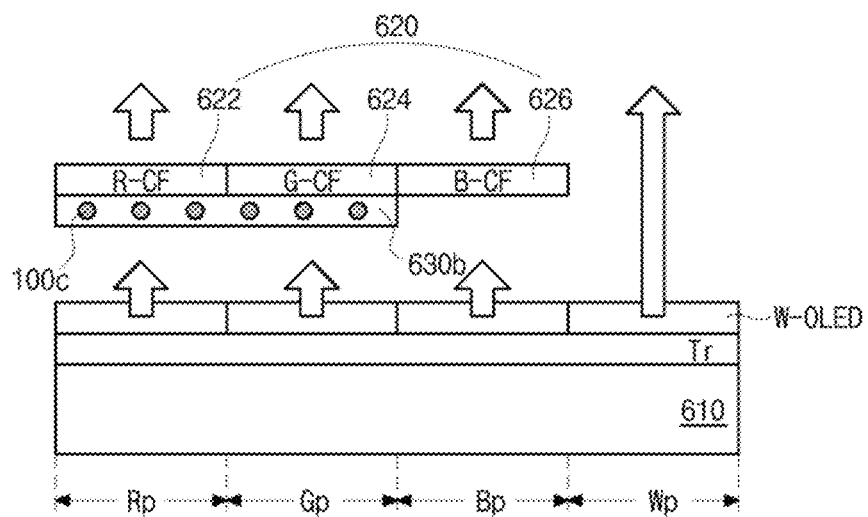
Figure 9C:
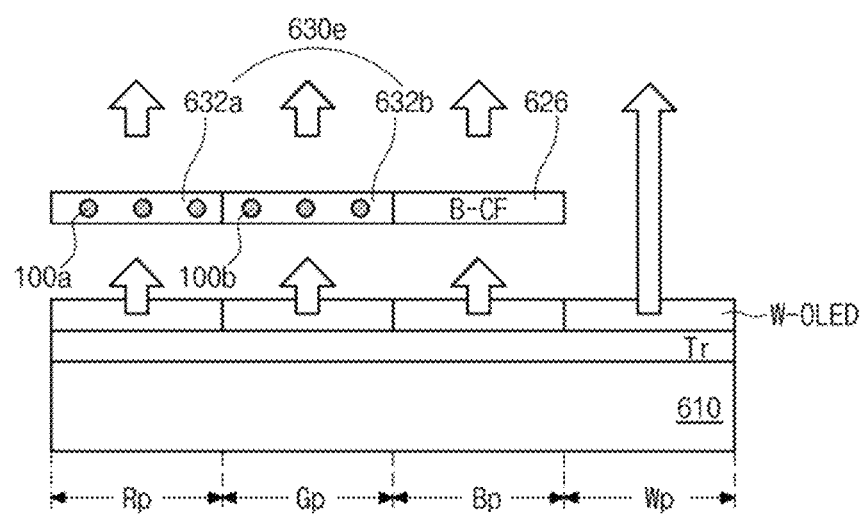

As shown in FIGS. 8 and 9A, a light emitting diode display device 600 includes a first substrate 610, where red, green, blue and white pixel regions Rp, Gp, Bp and Wp are defined, a second substrate 660 facing the first substrate 610, a light emitting diode 640 between the first and second substrates 610 and 660, a color filter layer 620, which is positioned between the second substrate 660 and the light emitting diode 640 and corresponds to the red, green and blue pixel regions Rp, Gp and Bp, and a color conversion layer 630, which is positioned between the color filter layer 620 and the light emitting diode 640 and corresponding to the red and green pixel regions Rp and Gp. The light emitting diode 640 singly covering the red, green, blue and white pixel regions Rp, Gp, Bp and Wp emits the white light. The light emitting diode 640 can include an organic emitting material. In this instance, the light emitting diode 640 can be referred to as a white organic light emitting diode (W-OLED). Alternatively, the light emitting diode 640 can include an inorganic emitting material such as the QD.

The first substrate 610 can be formed of a transparent material or an opaque material. For example, the first substrate 610 can be a plastic substrate of polyimide, a glass substrate or a metal foil. The second substrate 660 can be formed of a transparent material. For example, the second substrate 660 can be a plastic substrate of polyimide or a glass substrate.

A polarization plate can be disposed at a display surface of the light emitting diode display device 600, i.e., an outer side of the second substrate 660, to prevent an ambient light reflection. For example, the polarization plate can be a right-handed circular polarization plate or a left-handed circular polarization plate.

An adhesive layer 650 is positioned between the second substrate 660 and the light emitting diode 640. For example, the adhesive layer 650 is positioned between the color conversion layer 630 and the light emitting diode 640 in the red and green pixel regions Rp and Gp, between the color filter layer 620 and the light emitting diode 640 in the blue pixel region Bp, and between the second substrate 660 and the light emitting diode 640 in the white pixel region Wp. In addition, a barrier layer for preventing ambient moisture penetration can be formed between the light emitting diode 640 and the adhesive layer 650. For example, the barrier layer can has a triple-layered structure of a first inorganic layer, an organic layer and a second inorganic layer sequentially stacked on the light emitting diode 640. Although not shown, gate lines and data lines, which cross each other to define the red, green, blue and white pixel regions Rp, Gp, Bp and Wp, and a power line, which is parallel to and spaced apart from the gate line or the data line, are formed on the first substrate 610.

A thin film transistor (TFT) Tr as a driving element is formed on the first substrate 610 and in each of the pixel regions Rp, Gp, Bp and Wp. The light emitting diode 640 is electrically connected to the TFT Tr. The TFT Tr can include a semiconductor layer, a gate electrode over the semiconductor layer and source and drain electrodes over the gate electrode and spaced apart from each other. The source and drain electrodes can be connected to both ends of the semiconductor layer, respectively.

In addition, a switching TFT, which is electrically connected to the TFT Tr, the gate line and the data line, and a storage capacitor, which is connected to the switching TFT and the power line, can be further formed on the first substrate 610. When the switching TFT is turned-on by a gate signal provided through the gate line, a data signal through the data line is applied into a gate electrode of the TFT Tr and an electrode of the storage capacitor through the switching TFT.

When the TFT Tr is turned on by the data signal, an electric current is supplied to the light emitting diode 640 from the power line. As a result, the light emitting diode emits light.

A planarization layer 636, which is formed between the TFT and the light emitting diode 640, can be formed of an inorganic insulating material, e.g., silicon oxide or silicon nitride, or an organic insulating material, e.g., photo-acryl.

The color filter layer 620 is positioned on or over an inner side of the second substrate 660 and includes red, green and blue color filter patterns 622, 624 and 626 respectively corresponding to the red, green and blue pixel regions Rp, Gp and Bp. The white light from the light emitting diode 640 passes through the red, green and blue color filter patterns 622, 624 and 626, and the red light from the red color filter pattern 622, the green light from the green color filter pattern 624 and the blue light from the blue color filter pattern 626 passes through the second substrate 660. On the other hand, there is no color filter pattern in the white pixel region Wp.

The red color filter pattern (R-CF) 622 includes red pigment or red dye. When the white light is incident to the red color filter pattern 622, the light of the blue wavelength to the green wavelength is absorbed and the light of the red wavelength is transmitted. The green color filter pattern (G-CF) 624 includes green pigment or green dye. When the white light is incident to the green color filter pattern 624, the light of the blue wavelength and the red wavelength is absorbed and the light of the green wavelength is transmitted. The blue color filter pattern (B-CF) 626 includes blue pigment or blue dye. When the white light is incident to the blue color filter pattern 626, the light of the green wavelength to the red wavelength is absorbed and the light of the blue wavelength is transmitted.

When the color filter layer 620 is formed between the second substrate 660 and the light emitting diode 640 without the color conversion layer 630, the optical efficiency is decreased. Namely, only red wavelength light, only green wavelength light and only blue wavelength light are respectively transmitted in the red, green and blue pixel regions Rp, Gp and Bp.

However, in the present invention, the color conversion layer 630 including the luminous bodies 100a and 100b is formed between the color filter layer 620 and the light emitting diode 640. The color conversion layer 630 includes a first color conversion layer (red color conversion layer) 632 in the red pixel region Rp and a second color conversion layer (green color conversion layer) 634 in the green pixel region Gp. Namely, there is no color conversion layer in the blue pixel region Bp and the white pixel region Wp.

The first color conversion layer 632 includes a red luminous body 100a. The red luminous body 100a includes a red emission moiety 110a, an encapsulation moiety 140 surrounding the red emission moiety 110a, and optionally further includes a curable moiety 150 (of FIG. 2A). The red emission moiety 110a includes a red inorganic emission particle 120a and a coating layer 130 surrounding the red inorganic emission particle 120a. The red inorganic emission particle 120a can include a red core 122a and a shell 124a surrounding the red core 122a. The light from the light emitting diode 640 is converted or changed into a red wavelength light, e.g., a light having a peak wavelength range of about 600 to 640 nm, by the first color conversion layer 632.

The second color conversion layer 634 includes a green luminous body 100b. The green luminous body 100b includes a green emission moiety 110b, an encapsulation moiety 140 surrounding the green emission moiety 110b, and optionally further includes a curable moiety 150. The green emission moiety 110b includes a green inorganic emission particle 120b and a coating layer 130 surrounding the green inorganic emission particle 120b. The green inorganic emission particle 120b can include a green core 122b and a shell 124b surrounding the green core 122b. The light from the light emitting diode 640 is converted into a green wavelength light, e.g., a light having a peak wavelength range of about 500 to 570 nm, by the second color conversion layer 634.

When the white light from the light emitting diode 640 is incident to the first color conversion layer 632 in the red pixel region Rp, the blue light and the green light, which have a wavelength being smaller than the red light, are converted into the red light by the red luminous body 100a in the first color conversion layer 632. Accordingly, most of the white light from the light emitting diode 640 in the red pixel region Rp passes through the first color conversion layer 632 by the red light such that the light amount being absorbed by the red color filter pattern 622 is reduced and the optical efficiency is improved.

In addition, when the white light from the light emitting diode 640 is incident to the second color conversion layer 634 in the green pixel region Gp, the blue light, which has a wavelength being smaller than the green light, are converted into the green light by the green luminous body 100b in the second color conversion layer 634. Accordingly, most of the white light from the light emitting diode 640 in the green pixel region Gp passes through the second color conversion layer 634 by the green light such that the light amount being absorbed by the green color filter pattern 624 is reduced and the optical efficiency is improved.

On the other hand, there is no color conversion layer in the blue pixel region Bp. Generally, it is difficult to change low energy light, i.e., long wavelength light, into high energy light, i.e., short wavelength light. Even if a color conversion layer including a blue luminous body, the green and red light are not changed into the blue light by the color conversion layer in the blue pixel region Bp. Accordingly, there is no color conversion layer in the blue pixel region Bp. When the white light from the light emitting diode 640 in the blue pixel region Bp is incident to the blue color filter pattern 626, the other light except the blue light is absorbed and only the blue light is transmitted through the blue color filter pattern 626.

In addition, there is no color filter layer 620 and the color conversion layer 630 in the white pixel region Wp. Accordingly, the white light from the light emitting diode 640 in the white pixel region Wp passes through the second substrate 660 by the white light.

In the light emitting diode display device, the color conversion layer 630 including the first and second color conversion layers 632 and 634 is formed in the red and green pixel regions Rp and Gp. The white light from the light emitting diode 640 is converted into a pre-determined wavelength light, which can passes through the red and green color filter patterns 622 and 624, by the first and second color conversion layers 632 and 634. As a result, the amount of the light absorbed by the red and green color filter patterns 622 and 624 is reduced, and the optical efficiency of the device is improved.

On the other hand, when the color conversion layer includes conventional inorganic emission particle, there is a limitation in the density of the inorganic emission particle such that the optical efficiency of the device is decreased.

However, since each of the red and green luminous bodies 100a and 100b in the first and second color conversion layers 632 and 634 includes the plurality of emission moieties 110a and 110b included in single encapsulation moiety 140, the density of the inorganic emission particles 120a and 120b is improved. Accordingly, a color conversion efficiency of the color conversion layer 630 is improved or maintained with a thinner layer. As a result, a light leakage in the color conversion layer 630 is prevented, and the loss of the light from the light emitting diode 640 is prevented.

In addition, since the coating layer 130 covers or surrounds the surface of the inorganic emission particles 120a and 120b, the FRET problem, which can be caused between adjacent inorganic emission particles, is prevented or minimized. Further, due to the encapsulation moiety 140 and/or the curable moiety 150, which can be formed of silane-based material or siloxane-based material, the heating-resisting property of the luminous bodies 100a and 100b is improved. Accordingly, a thermal damage on the luminous bodies 100a and 100b by a heat from the light emitting diode 640 is minimized or prevented such that the color conversion efficiency of the color conversion layer 630 can be maintained.

Referring to FIG. 9B with FIG. 8, a light emitting diode display device 600B includes a first substrate 610, a second substrate 660 facing the first substrate 610, a TFT Tr on the first substrate 610, a light emitting diode (W-OLED) 640 connected to the TFT Tr, a color filter layer 620 over the W-OLED 640 and a color conversion layer 630b between the W-OLED 640 and the color filter layer 620. The color conversion layer 630b corresponds to the red and green pixel regions Rp and Gp except the blue and white pixel regions Bp and Wp.

The color conversion layer 630b include a luminous body 100c being capable of emitting red-green light and singly covers the red and green pixel regions Rp and Gp. The color conversion layer 630b can be referred to as a red-green color conversion layer. When the white light from the W-OLED 640 is incident to the color conversion layer 630b, the light, which has a wavelength range being shorter (smaller) than the red-green light wavelength range, is changed into the red-green light. Accordingly, a mixture of the red light, the green light and the red-green light is incident to the red color filter pattern 622 and the green color filter pattern 624 such that the amount of the light absorbed by the red color filter pattern 622 and the green color filter pattern 624 is reduced and the optical efficiency of the device is improved.

Referring to FIG. 9C, a light emitting diode display device 600E includes a W-OLED over the first substrate 610, a TFT Tr between the first substrate 610 and the W-OLED, a color conversion layer 630e on or over the W-OLED in the red and green pixel regions Rp and Gp and a color filter pattern 626 on or over the W-OLED in the blue pixel region Bp. There is no color conversion layer and color filter pattern in the white pixel region Wp. The color conversion layer 630e includes a first color conversion layer 632a and a second color conversion layer 632b, and the first and second color conversion layers 632a and 632b respectively include red and green luminous bodies 100a and 100b.

Since there is no color filter pattern in the red and green pixel regions Rp and Gp, the first and second color conversion layers 632a and 632b can directly face the second substrate 660 (of FIG. 8). Namely, the second substrate 660 can directly contact the color conversion layer 630 in the red and green pixel regions Rp and Gp and the color filter layer 626 in the blue pixel region Bp. In other word, when the adhesive layer 650 (of FIG. 8) is formed between the first and second substrates 610 and 660, the adhesive layer 650 has a uniform thickness in the red, green and blue pixel regions Rp, Gp and Bp because there is no color filter layer in the red and green pixel regions Rp and Gp and no color conversion layer in the blue pixel region Bp.

As mentioned above, the luminous bodies 100a and 100b have excellent emission property and heat-resisting property without the FRET. In addition, since the plurality of red luminous bodies 100a is included in single encapsulation moiety 140 (of FIG. 8) and the plurality of green luminous bodies 100b is included in single encapsulation moiety 140, the density of the luminous bodies 100a and 100b in the color conversion layer 630e is increased. Accordingly, the first color conversion layer 632a in the red pixel region Rp and the second color conversion layer 632b in the green pixel region Gp have functions of the color filter pattern as well as the color conversion layer. Namely, in the light emitting diode display device, since a color conversion property and a color purity are sufficiently provided without a color filter in the red and green pixel regions Rp and Gp, a thickness of the light emitting diode display device can be reduced.

Figure 10A:
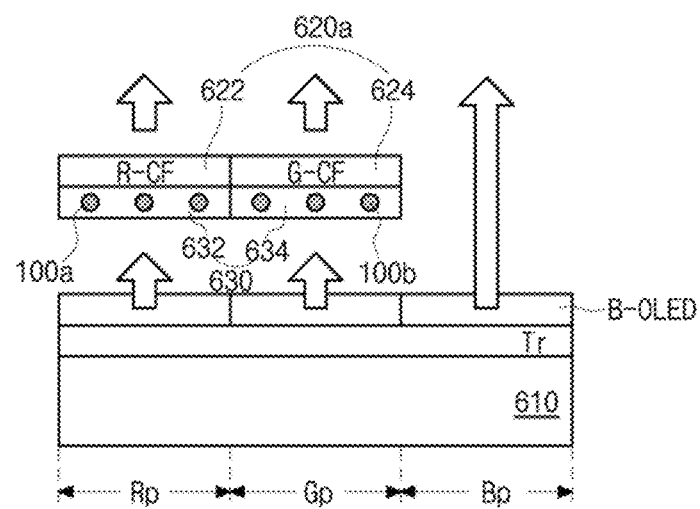
FIGS. 10A to 10C are schematic cross-sectional views illustrating a top-emission type B (blue)-OLED display device according to an embodiment of the present invention, respectively.
Figure 10B:
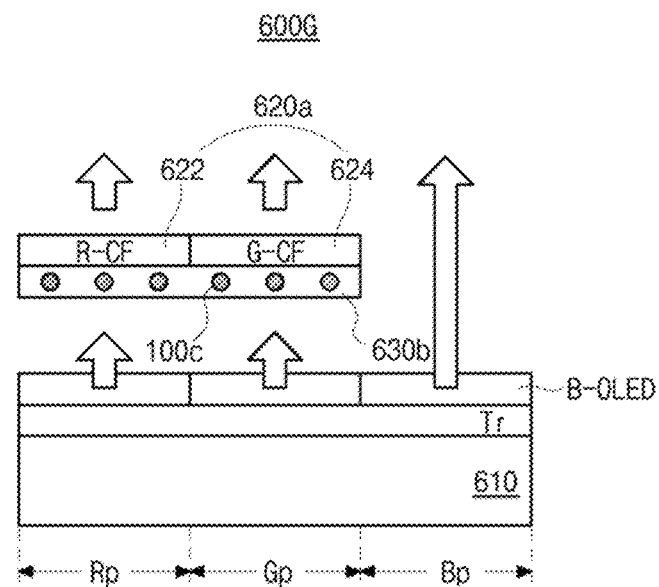
Figure 10C:
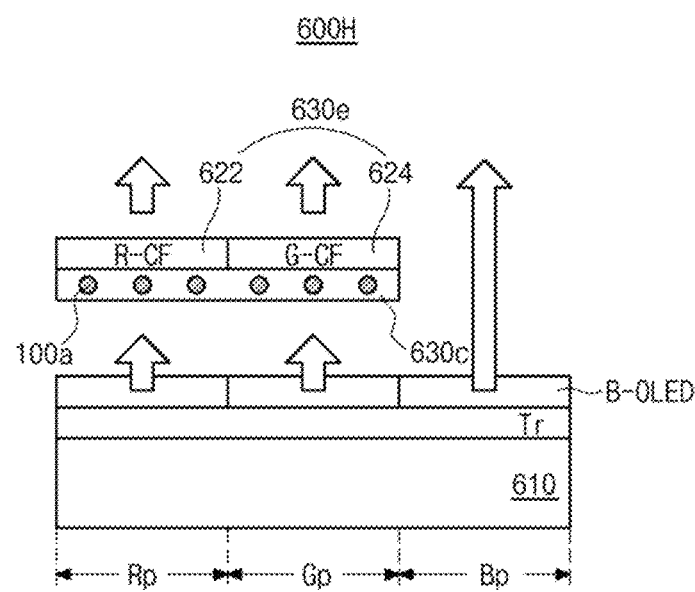

FIGS. 10A to 10C are schematic cross-sectional view illustrating a top-emission type B (blue)-OLED display device according to an embodiment of the present invention, respectively. Different from the display device explained with FIGS. 9A to 9C, the light emitting diode in FIGS. 10A to 10C emits a blue light.

As shown in FIG. 10A, a light emitting diode display device 600F includes a blue light emitting diode B-OLED over the first substrate 610, a TFT Tr between the first substrate 610 and the B-OLED, a color filter layer 620a over the B-OLED and a color conversion layer 630 between B-OLED and the color filter layer 620a.

The color filter layer 620a includes a red color filter pattern (R-CF) 622 in the red pixel region Rp and a green color filter pattern (G-CF) 624 in the green pixel region Gp. There is no color filter pattern in the blue pixel region Bp.

The color conversion layer 630 includes a first color conversion layer (red color conversion layer) 632 in the red pixel region Rp and a second color conversion layer (green color conversion layer) 634 in the green pixel region Gp. There is no color conversion layer in the blue pixel region Bp. Although not shown, the color conversion layer 630 can further include a third color conversion layer (white color conversion layer) in a white pixel region.

The first color conversion layer 632 includes a red luminous body 100a, and the second color conversion layer 634 includes a green luminous body 100b.

In the red pixel region Rp, the blue light from the B-OLED is changed into the red light by the first color conversion layer 632, the red light from the first color conversion layer 632 passes through the red color filter pattern 622. The blue light, which is not converted into the red light by the first color conversion layer 632, is absorbed by the red color filter pattern 622.

In the green pixel region Gp, the blue light from the B-OLED is changed into the green light by the second color conversion layer 634, the green light from the second color conversion layer 634 passes through the green color filter pattern 624. The blue light, which is not converted into the green light by the second color conversion layer 634, is absorbed by the green color filter pattern 624.

Since there is no color conversion layer and color filter pattern, the blue light from the B-OLED in the blue pixel region Bp passes through the second substrate 660 (of FIG. 8).

The third color conversion layer in the white pixel region includes both the red luminous body 100a and the green luminous body 100b. In addition, there is no color filter pattern in the white pixel region. In the white pixel region, a part of the blue light from the B-OLED is converted into the green light by the third color conversion layer, a part of the blue light from the B-OLED is converted into the red light by the third color conversion layer, and the other part of the blue light passes through the third color conversion layer without color conversion. Accordingly, the red, green and the blue light from the third color conversion layer are mixed such that the white light is emitted from the white pixel region.

In the light emitting diode display device 600F, the color conversion layer 630 including the luminous body of the present invention such that the amount of the light absorbed by the color filter layer 620a is reduced. Accordingly, the emission efficiency of the light emitting diode display device 600F is improved.

As shown in FIG. 10B, a light emitting diode display device 600G includes a blue light emitting diode B-OLED over the first substrate 610, a TFT Tr between the first substrate 610 and the B-OLED, a color filter layer 620a over the B-OLED and a color conversion layer 630b between B-OLED and the color filter layer 620a. The color filter layer 620a includes a red color filter pattern (R-CF) 622 in the red pixel region Rp and a green color filter pattern (G-CF) 624 in the green pixel region Gp. There is no color filter pattern in the blue pixel region Bp.

The color conversion layer 630b is disposed between the red color filter pattern 622 in the red pixel region Rp and the B-OLED and between the green color filter pattern 624 and the B-OLED. There is no color conversion layer in the blue pixel region Bp. The color conversion layer 630b includes a red-green luminous body 100c, and single color conversion layer 630b corresponds to the red and green pixel regions Rp and Gp. The color conversion layer 630b can be referred to as a red-green color conversion layer. Although not shown, when there is a white pixel region, the color conversion layer 630b including the red-green luminous body 100c is also formed in the white pixel region without a color filter layer. Accordingly, when there is an adhesive layer 650 (of FIG. 8) between the first substrate 610 and the second substrate 660 (of FIG. 8), a thickness of the adhesive layer 650 in the white pixel region can be larger than a thickness of the adhesive layer 650 in the red and green pixel regions Rp and Gp and smaller than a thickness of the adhesive layer 650 in the blue pixel region Bp.

When the blue light from the B-OLED is incident to the color conversion layer 630b, the light, which has a wavelength range being shorter (smaller) than the red-green light wavelength range, is changed into the red-green light. Accordingly, a mixture of the red light, the green light and the red-green light is incident to the red color filter pattern 622 and the green color filter pattern 624 such that the amount of the light absorbed by the red color filter pattern 622 and the green color filter pattern 624 is reduced and the optical efficiency of the device is improved.

Referring to FIG. 10C, a light emitting diode display device 600J includes a B-OLED over the first substrate 610, a TFT Tr between the first substrate 610 and the B-OLED and a color conversion layer 630e on or over the B-OLED in the red and green pixel regions Rp and Gp. The color conversion layer 630e includes a first color conversion layer 632a and a second color conversion layer 632b, and the first and second color conversion layers 632a and 632b respectively include red and green luminous bodies 100a and 100b. There is no color conversion layer and color filter pattern in the blue pixel region Bp.

As mentioned above, since the plurality of red luminous bodies 100a is included in single encapsulation moiety 140 (of FIG. 8) and the plurality of green luminous bodies 100b is included in single encapsulation moiety 140, the density of the luminous bodies 100a and 100b in the color conversion layer 630e is increased. Accordingly, the first color conversion layer 632a in the red pixel region Rp and the second color conversion layer 632b in the green pixel region Gp have functions of the color filter pattern as well as the color conversion layer. Namely, in the light emitting diode display device, since a color conversion property and a color purity are sufficiently provided without a color filter in the red and green pixel regions Rp and Gp, a thickness of the light emitting diode display device can be reduced.

Referring again to FIG. 8, the light emitting diode 640 is disposed on the planarization layer 636 and includes a first electrode 642, a second electrode 646 and an emitting layer 644 therebetween. For example, the light emitting diode 640 can be an organic light emitting diode or an inorganic light emitting diode such as a quantum dot light emitting diode.

The first electrode 642 is positioned on the planarization layer 636 and is separately formed in each pixel regions Rp, Gp, Bp and Wp. The first electrode 642 is connected to the TFT Tr. For example, the first electrode 642 can be an anode and can include (or be formed of) a conductive material having a relatively high work function. For example, the first electrode 642 can be formed of a transparent conductive material such as indium-tin-oxide (ITO), indium-zinc-oxide (IZO), indium-tin-zinc oxide (ITZO), indium-copper-oxide (ICO), tin oxide ($SnO_2$), indium oxide ($In_2O_3$), cadmium-zinc oxide alloy (Cd:ZnO), fluorine-tin oxide alloy (F:$SnO_2$), indium-tin oxide alloy (In: $SnO_2$), gallium-tin oxide alloy (Ga:$SnO_2$) or aluminum-zinc oxide alloy (Al: ZnO; AZO). The above materials can be doped or non-doped.

The emitting layer 644 is disposed on the first electrode 642 and emits the white light or the blue light. In FIG. 8, the emitting layer 644 has a single-layered structure. Alternatively, the emitting layer 644 can have a multi-layered structure or a plurality of emitting units.

For example, the emitting layer 644 can include a first emitting unit, a second emitting unit and a charge generation layer (CGL) therebetween. The first emitting unit, which is disposed between the first electrode 642 and the CGL, can include a hole injection layer (HIL), a first hole transporting layer (HTL), a first emitting material layer (EML) and a first electron transporting layer (ETL). The second emitting unit, which is disposed between the CGL and the second electrode 646, can include a second HTL, a second EML, a second ETL and an electron injection layer (EIL). When one of the first and second EMLs emits the blue light and the other one of the first and second EMLs emits the green light, the yellow-green light or the orange light, the light emitting diode 640 emits the white light.

In FIG. 8, the emitting layer 644 is formed on an entire of a display device including the red, green, blue and white pixel regions Rp, Gp, Bp and Wp. Alternatively, the emitting layer 644 can be separately formed in the red, green, blue and white pixel regions Rp, Gp, Bp and Wp.

The second electrode 646 is disposed on the emitting layer 644 and is formed on an entire of a display device including the red, green, blue and white pixel regions Rp, Gp, Bp and Wp. The second electrode 646 can be a cathode and can be formed of a conductive material having a relatively low work function. For example, the second electrode 646 can be formed of Ca, Ba, Al, LiF, $BaF_2$, CsF, $CaCO_3$, Mg, Au—Mg alloy or Ag—Mg alloy. The second electrode 646 can have a single-layered structure of Ca, Ba, Al, Mg, Au—Mg alloy or Ag—Mg alloy or a double-layered structure of Ca/Al, LiF/Ca, LiF/Al, $BaF_2$/Al, CsF/Al, $CaCO_3$/Al, $BaF_2$/Ca/Al or Al/Mg.

In addition, a bank layer 648 is formed under the emitting layer 644 to cover an edge of the first electrode 642. The bank layer 648 can be omitted.

When the voltage is applied to the light emitting diode 640, the white light is emitted from the light emitting diode 640 and the white light passes through the color conversion layer 630 and the color filter layer 620. As a result, an image is displayed at a side of the second substrate 660. Namely, the light emitting diode display device 600 is a top-emission type display device.

In the top-emission type light emitting diode display device 600, since the color conversion layer 630, by which the light from the light emitting diode 640 is converted or changed into a pre-determined wavelength light, is formed between the color filter layer 620 and the light emitting diode 640, the amount of the light absorbed by the color filter layer 620 is minimized such that the optical efficiency is improved. In addition, since the luminous body 100a and 100b in the color conversion layers 630 includes the plurality of emission moieties 110a and 110b included in single encapsulation moiety 140, the density of the inorganic emission particles 120a and 120b are improved. Accordingly, a color conversion efficiency of the color conversion layer 630 is improved or maintained with a thinner layer.

In addition, since the coating layer 130 covers or surrounds the surface of the inorganic emission particles 120a and 120b, the FRET problem, which can be caused between adjacent inorganic emission particles, is prevented or minimized. As a result, the luminous bodies 100a and 100b have good brightness. Further, due to the encapsulation moiety 140 and/or the curable moiety 150, which have excellent heat-resisting property, the heating-resisting property of the luminous bodies 100a and 100b are improved.

Figure 11:
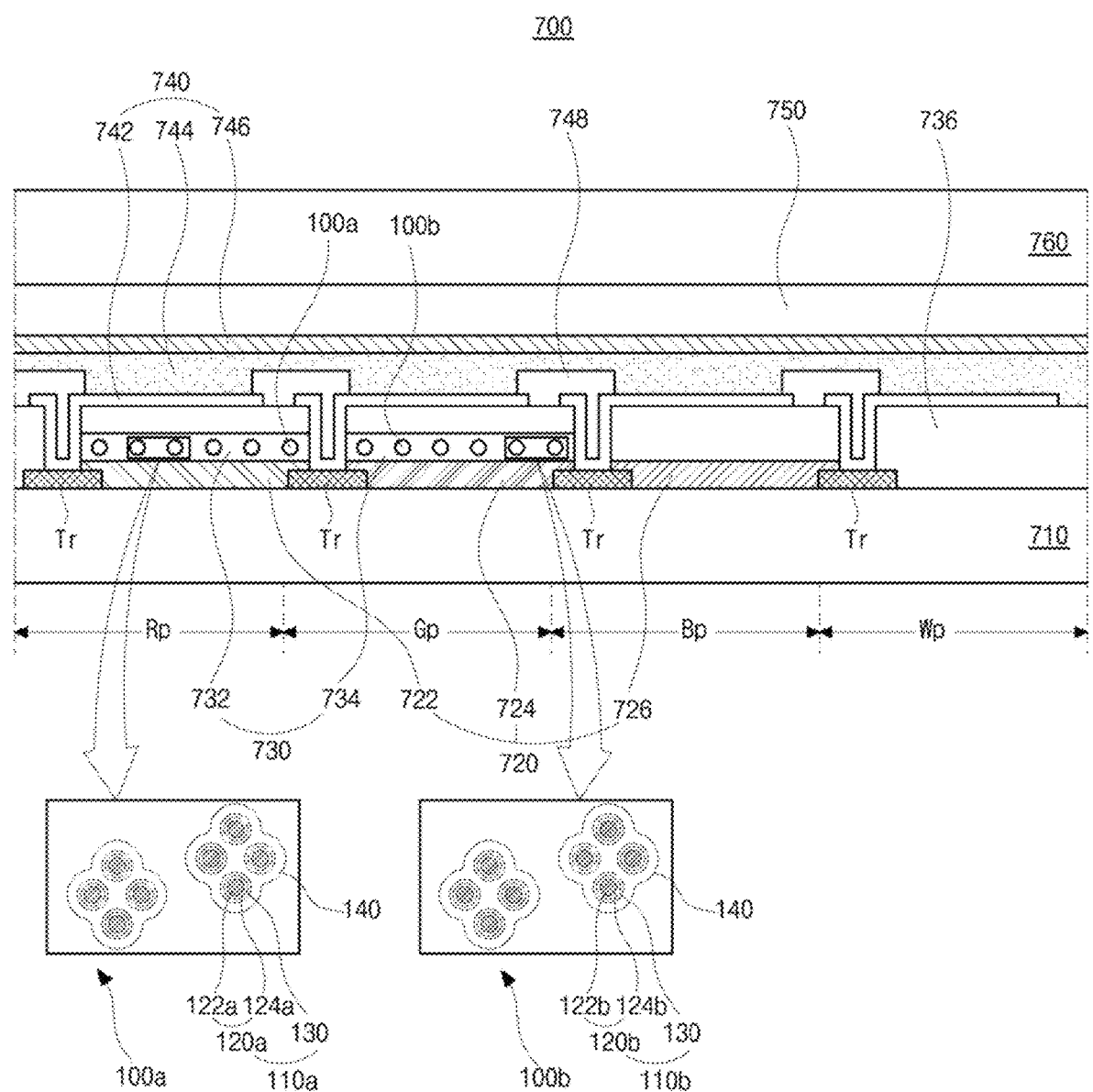
FIG. 11 is a schematic cross-sectional view illustrating a bottom-emission type light emitting diode display device according to an embodiment of the present invention.

FIG. 11 is a schematic cross-sectional view illustrating a bottom-emission type light emitting diode display device according to an embodiment of the present invention. The light emitting diode in the display device of FIG. 11 emits the white light.

As shown in FIG. 11, a light emitting diode display device 700 includes a first substrate 710, where red, green, blue and white pixel regions Rp, Gp, Bp and Wp are defined, a second substrate 760 facing the first substrate 710, a light emitting diode 740 between the first and second substrates 710 and 760, a color filter layer 720, which is positioned between the first substrate 710 and the light emitting diode 740 and corresponds to the red, green and blue pixel regions Rp, Gp and Bp, and a color conversion layer 730, which is positioned between the color filter layer 720 and the light emitting diode 740 and corresponding to the red and green pixel regions Rp and Gp. The light emitting diode 740 singly covering the red, green, blue and white pixel regions Rp, Gp, Bp and Wp emits the white light. The light emitting diode 740 can include an organic emitting material. In this instance, the light emitting diode 740 can be referred to as a white organic light emitting diode (W-OLED). Alternatively, the light emitting diode 740 can include an inorganic emitting material such as the QD.

The first substrate 710 can be formed of a transparent material. For example, the first substrate 710 can be a plastic substrate of polyimide or a glass substrate. The second substrate 760 can be formed of a transparent material or an opaque material. For example, the second substrate 760 can be a plastic substrate of polyimide, a glass substrate or a metal foil.

An adhesive layer 750 is positioned between the second substrate 760 and the light emitting diode 740, and a barrier layer for preventing ambient moisture penetration can be formed between the light emitting diode 740 and the adhesive layer 750. In addition, a polarization plate can be disposed at a display surface of the light emitting diode display device 700, i.e., an outer side of the first substrate 710, to prevent an ambient light reflection.

A TFT Tr as a driving element is formed on the first substrate 710 and in each of the pixel regions Rp, Gp, Bp and Wp. The TFT Tr can include a semiconductor layer, a gate electrode over the semiconductor layer and source and drain electrodes over the gate electrode and spaced apart from each other. The source and drain electrodes can be connected to both ends of the semiconductor layer, respectively.

A planarization layer 736 is formed on the color conversion layer 730 in the red and green pixel regions Rp and Gp, the color filter layer 720 in the blue pixel region Bp and the TFT Tr in the white pixel region Wp. The planarization layer 736 is formed on an entire surface of the first substrate 710 to provide a flat top surface. The planarization layer 736 can be formed of an inorganic insulating material, e.g., silicon oxide or silicon nitride, or an organic insulating material, e.g., photo-acryl, but it is not limited thereto.

The light emitting diode 740 is disposed on the planarization layer 736 and includes a first electrode 742, a second electrode 746 and an emitting layer 744 therebetween. For example, the light emitting diode 740 can be an organic light emitting diode or an inorganic light emitting diode such as a quantum dot light emitting diode. A bank layer 748, which covers an edge of the first electrode 742, may be formed under the emitting layer 744. The bank layer 748 may be omitted.

When the voltage is applied to the light emitting diode 740, the white light is emitted from the light emitting diode 740 and the white light passes through the color conversion layer 730 and the color filter layer 720. As a result, an image is displayed at a side of the first substrate 710. Namely, the light emitting diode display device 700 is a bottom-emission type display device.

The color filter layer 720 is positioned on or over an inner side of the first substrate 710 and includes red, green and blue color filter patterns 722, 724 and 726 respectively corresponding to the red, green and blue pixel regions Rp, Gp and Bp. The white light from the light emitting diode 740 passes through the red, green and blue color filter patterns 722, 724 and 726, and the red light from the red color filter pattern 722, the green light from the green color filter pattern 724 and the blue light from the blue color filter pattern 726 passes through the first substrate 710. On the other hand, there is no color filter pattern in the white pixel region Wp such that the white light passes through the first substrate 710.

The red color filter pattern 722 includes red pigment or red dye. When the white light is incident to the red color filter pattern 722, the light of the blue wavelength to the green wavelength is absorbed and the light of the red wavelength is transmitted. The green color filter pattern 724 includes green pigment or green dye. When the white light is incident to the green color filter pattern 724, the light of the blue wavelength and the red wavelength is absorbed and the light of the green wavelength is transmitted. The blue color filter pattern 726 includes blue pigment or blue dye. When the white light is incident to the blue color filter pattern 726, the light of the green wavelength to the red wavelength is absorbed and the light of the blue wavelength is transmitted.

Since a pre-determined wavelength light is transmitted through each of the color filter patterns 722, 724, 726, the optical efficiency is decreased. To prevent the decrease of the optical efficiency, the color conversion layer 730 including the luminous bodies 100a and 100b is formed between the color filter layer 720 and the light emitting diode 740. The color conversion layer 730 includes a first color conversion layer (red color conversion layer) 732 on the red color filter pattern 722 and in the red pixel region Rp and a second color conversion layer (green color conversion layer) 734 on the green color filter pattern 724 and in the green pixel region Gp. Namely, there is no color conversion layer in the blue pixel region Bp and the white pixel region Wp.

The first color conversion layer 732 includes a red luminous body 100a. The red luminous body 100a includes a red emission moiety 110a, an encapsulation moiety 140 surrounding the red emission moiety 110a, and optionally further includes a curable moiety 150 (of FIG. 2A). The red emission moiety 110a includes a red inorganic emission particle 120a and a coating layer 130 surrounding the red inorganic emission particle 120a. The red inorganic emission particle 120a can include a red core 122a and a shell 124a surrounding the red core 122a. The light from the light emitting diode 740 is converted into a red wavelength light, e.g., a light having a peak wavelength range of about 600 to 640 nm, by the first color conversion layer 732.

The second color conversion layer 734 includes a green luminous body 100b. The green luminous body 100b includes a green emission moiety 110b, an encapsulation moiety 140 surrounding the green emission moiety 110b, and optionally further includes a curable moiety 150. The green emission moiety 110b includes a green inorganic emission particle 120b and a coating layer 130 surrounding the green inorganic emission particle 120b. The green inorganic emission particle 120b can include a green core 122b and a shell 124b surrounding the green core 122b. The light from the light emitting diode 740 is converted into a green wavelength light, e.g., a light having a peak wavelength range of about 500 to 570 nm, by the second color conversion layer 734.

When the white light from the light emitting diode 740 is incident to the first color conversion layer 732 in the red pixel region Rp, the blue light and the green light, which have a wavelength being smaller than the red light, are converted into the red light by the first color conversion layer 732. Accordingly, most of the white light from the light emitting diode 740 in the red pixel region Rp passes through the first color conversion layer 732 by the red light such that the light amount being absorbed by the red color filter pattern 722 is reduced and the optical efficiency is improved.

In addition, when the white light from the light emitting diode 740 is incident to the second color conversion layer 734 in the green pixel region Gp, the blue light, which has a wavelength being smaller than the green light, are converted into the green light by the second color conversion layer 734. Accordingly, most of the white light from the light emitting diode 740 in the green pixel region Gp passes through the second color conversion layer 734 by the green light such that the light amount being absorbed by the green color filter pattern 724 is reduced and the optical efficiency is improved.

On the other hand, there is no color conversion layer in the blue pixel region Bp. Generally, it is difficult to change the low energy light, i.e., the long wavelength light, into the high energy light, i.e., the short wavelength light. Even if a color conversion layer including a blue luminous body, the green and red light are not changed into the blue light by the color conversion layer in the blue pixel region Bp. Accordingly, there is no color conversion layer in the blue pixel region Bp. When the white light from the light emitting diode 740 in the blue pixel region Bp is incident to the blue color filter pattern 726, the other light except the blue light is absorbed and only the blue light is transmitted through the blue color filter pattern 726.

In addition, there is no color filter layer 720 and the color conversion layer 730 in the white pixel region Wp. Accordingly, the white light from the light emitting diode 740 in the white pixel region Wp passes through the first substrate 710 by the white light.

In the light emitting diode display device, the color conversion layer 730 including the first and second color conversion layers 732 and 734 is formed in the red and green pixel regions Rp and Gp. The white light from the light emitting diode 740 is converted into a pre-determined wavelength light, which can passes through the red and green color filter patterns 722 and 724, by the first and second color conversion layers 732 and 734. As a result, the amount of the light absorbed by the red and green color filter patterns 722 and 724 is reduced, and the optical efficiency of the device is improved.

Since each of the red and green luminous bodies 100a and 100b in the first and second color conversion layers 732 and 734 includes the plurality of emission moieties 110a and 110b included in single encapsulation moiety 140, the density of the inorganic emission particles 120a and 120b are improved. Accordingly, a color conversion efficiency of the color conversion layer 730 is improved or maintained with a thinner layer. In addition, since the coating layer 130 covers or surrounds the surface of the inorganic emission particles 120a and 120b, the FRET problem, which can be caused between adjacent inorganic emission particles, is prevented or minimized. As a result, the luminous bodies 100a and 100b have good brightness. Further, due to the encapsulation moiety 140 and/or the curable moiety 150, which have excellent heat-resisting property, the heating-resisting property of the luminous bodies 100a and 100b are improved.

As shown in FIGS. 9A to 9C and 10A to 10C, various modifications of the color conversion layer and the color filter layer are applied to the bottom-emission type light emitting diode display device of FIG. 11. In this instance, due to the color conversion layer, the emission efficiency of the bottom-emission type light emitting diode display device is improved.

[Inorganic Light Emitting Diode and Light Emitting Device]

Figure 12:
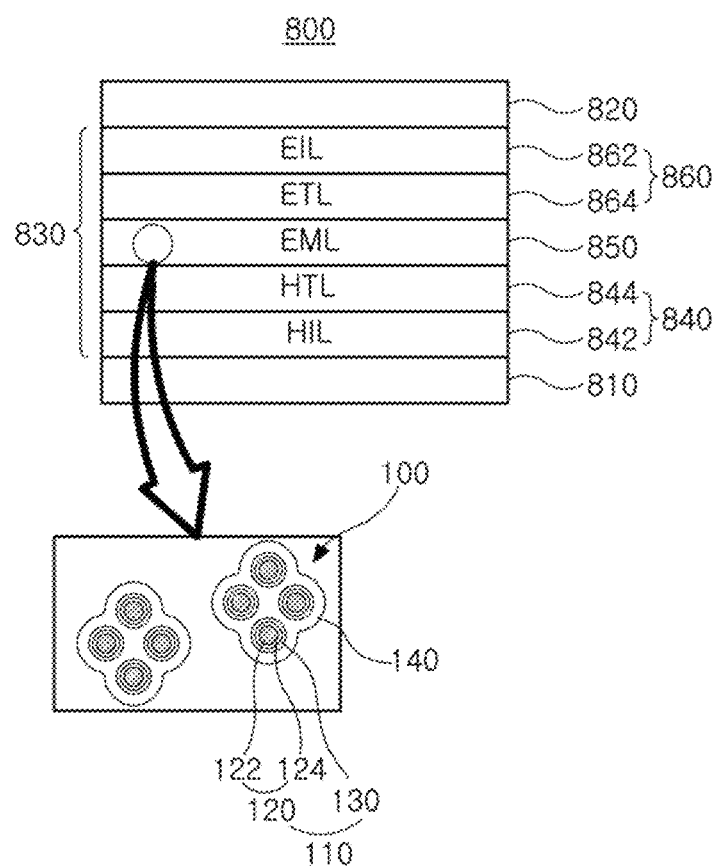
FIG. 12 is a schematic cross-sectional view illustrating an inorganic light emitting diode according to an embodiment of the present invention.

The luminous body of the present invention has excellent emission property and heat-resisting property and emits various wavelength lights. Accordingly, the luminous body is used for a material of an emitting material layer (EML) in an inorganic light emitting diode such as a quantum dot light emitting diode (QD-LED or QLED). FIG. 12 is a schematic cross-sectional view illustrating an inorganic light emitting diode according to an embodiment of the present invention. The inorganic light emitting diode has a normal structure and includes the luminous body in the EML.

As shown in FIG. 12, an inorganic light emitting diode 800 includes a first electrode 810, a second electrode 820 facing the first electrode 810 and an emitting layer 830 therebetween. The emitting layer 830 includes an EML 850. For example, the emitting layer 830 can further include a first charge transporting layer 840 between the first electrode 810 and the EML 850 and a second charge transporting layer 860 between the EML 850 and the second electrode 820.

The first electrode 810 can be an anode, i.e., a hole injection electrode. The first electrode 810 can be formed on or over a substrate of glass or polymer. For example, the first electrode 810 can include ITO, IZO, ITZO, ICO, $SnO_2$, $In_2O_3$, Cd:ZnO, F:$SnO_2$, In:$SnO_2$, Ga:SnO, AZO, Ni, Pt, Au, Ag, Ir or carbon nanotube (CNT). The above materials can be doped or non-doped.

The second electrode 820 can be a cathode, i.e., an electron injection electrode. For example, the second electrode 820 can be formed of Ca, Ba, Al, LiF, $BaF_2$, CsF, $CaCO_3$, Mg, Au—Mg alloy or Ag—Mg alloy. The second electrode 820 can have a single-layered structure of Ca, Ba, Al, Mg, Au—Mg alloy or Ag—Mg alloy or a multi-layered structure of Ca/Al, LiF/Ca, LiF/Al, BaF$_2$/Al, CsF/Al, CaCO$_3$/Al, BaF$_2$/Ca/Al or Al/Mg. Each of the first and second electrodes 810 and 820 can have a thickness of 30 to 300 nm.

In a bottom-emission type inorganic light emitting diode, the first electrode 810 can include ITO, IZO, ITZO or AZO, and the second electrode 820 can include Ca, Ba, Ca/Al, LiF/Ca, LiF/Al, BaF$_2$/Al, Al, Mg or Ag—Mg alloy.

The first charge transporting layer 840 is positioned between the first electrode 810 and the EML 850. For example, a hole from the first electrode 810 can be transported into the EML 850 by the first charge transporting layer 840. The first charge transporting layer 840 can include an HIL 842 closer to the first electrode 810 and an HTL 844 closer to the EML 850.

The hole is efficiently injected from the first electrode 810 to the EML 850 by the HIL 842. For example, the HIL 842 can include an organic material selected from the group consisting of 4,4',4"-tris(3-methylphenylphenylamino)triphenylamine (MTDATA), p-doping phthalocyanine, e.g., F4-TCNQ doped zinc phthalocyanine, F4-TCNQ doped N,N'-diphenyl-N,N'-bis(1-naphthyl)-1,1'-biphenyl-4,4"-diamine (α-NPD), 1,4,5,8,9,11-hexaazatriphenylenehexacarbonitrile (HATCN) or their combination, but it is not limited thereto. For example, the dopant such as F4-TCNQ can be doped by a weight % of 1 to 30 with respect to the host. The HIL 842 can be omitted.

The hole is efficiently transported from the first electrode 810 to the EML 850 by the HTL 844. The HTL 844 can be formed of an inorganic material or an organic material. For example, when the HTL 844 is formed of the organic material, the HTL 844 can include an organic material selected from the group consisting of an amine compound, e.g., 4,4'-N,N'-dicarbazolyl-biphenyl (CBP), N,N'-diphenyl-N,N'-bis(1-naphtyl)-1,1'-biphenyl-4,4"-diamine α-NPD), N,N'-diphenyl-N,N'-bis(3-methylphenyl)-(1,1'-biphenyl)-4,4'-diamine (TPD), N,N'-bis(3-methylphenyl)-N,N'-bis(phenyl)-spiro (spiro-TPD), N,N'-di(4-(N,N'-diphenyl-amino)phenyl)-N,N'-diphenylbenzidine (DNTPD) or 4,4',4"-tris(N-carbazolyl)-triphenylamine (TCTA), polyaniline, polypyrrole, poly(phenylenevinylene), copper phthalocyanine, aromatictertiary amine, polynuclear aromatic tertiary amine, 4,4'-bis(p-carbazolyl)-1,1'-biphenyl compound, N,N,N',N'-tetraarylbenzidine, PEDOT:PSS, poly(N-vinylcarbazole) (PVK), poly[2-methoxy-5-(2-ethylhexyloxy)-1,4-phenylenevinylene] (MEH-PPV), poly[2-methoxy-5-(3',7'-dimethyloctyloxy)-1,4-phenylenevinylene] (MOMO-PPV), polymethacrylate, poly(9,9-octylfluorene), poly(spiro-fluorene), N,N'-di(naphthalene-1-yl)-N,N'-diphenyl-benzidine (NPB), tris(3-methylphenylphenylamino)-triphenylamine (m-MTDATA), poly(9,9'-dioctylfluorenyl-2,7-diyl)-co-(4,4'-(N-(4-secbutylphenyl)diphenylamine (TFB), poly(4-butylphenyl-dipnehylamine) (poly-TPD), spiro-NPB or their combination.

When the HTL 844 is formed of the inorganic material, the HTL 844 can include NiO, MoO$_3$, Cr$_2$O$_3$, Bi$_2$O$_3$, p-type ZnO, CuSCN, Mo$_2$S, p-type GaN, or their combination.

In FIG. 12, the first charge transporting layer 840 has a double-layered structure of the HIL 842 and the HTL 844. Alternatively, the first charge transporting layer 840 can have a single-layered structure of the HTL 844 without the HIL 842.

The first charge transporting layer 840 including the HIL 842 and the HTL 844 can be formed by a vacuum deposition process, e.g., vacuum vapor deposition or sputtering, or a solution process, e.g., spin coating, drop coating, dip coating, spray coating, roll coating, flow coating, casting process, screen printing or inkjet printing. The vacuum deposition process and the solution process single or in combination are used for forming the first charge transporting layer 840. Each of the HIL 842 and the HTL 844 can have a thickness of 10 to 200 nm, beneficially 10 to 100 nm, but it is not limited thereto.

The EML 850 includes the luminous body 100 of the present invention. The luminous body 100 includes the emission moiety 110 and the encapsulation moiety 140, and optionally further includes the curable moiety 150 (of FIG. 2A). The emission moiety 110 includes the inorganic emission particle 120 and the coating layer 130 surrounding the inorganic emission particle 120. The inorganic emission particle 120 can include the core 122 and the shell 124 surrounding the core 122. Since the EML 850 includes the emission moiety 110 including the inorganic emission particle 120, the color purity of the inorganic light emitting diode 800 is improved.

For example, a solution including the luminous body 100 dispersed in the solvent is coated on the first charge transporting layer 840 by a solution process, and the solvent is evaporated to form the EML 850. The solution process for the EML 850 can be spin coating, drop coating, dip coating, spray coating, roll coating, flow coating, casting process, screen printing or inkjet printing.

For example, the EML 850 includes an inorganic emission particle 120 having PL peak of 440 nm, an inorganic emission particle 120 having PL peak of 530 nm and an inorganic emission particle 120 having PL peak of 620 nm and is formed on entire of a display area such that a white light emitting diode is provided.

The second charge transporting layer 860 is positioned between the EML 850 and the second electrode 820. The electron is transported from the second electrode 820 into the EML 850 by the second charge transporting layer 860. For example, the second charge transporting layer 860 can include an EIL 862 closer to the second electrode 820 and an ETL 864 closer to the EML 850.

The electron is efficiently injected from the second electrode 820 into the EML 850 by the EIL 862. For example, the EIL 862 can be formed of a fluorine-doped or non-doped metal, e.g., Al, Cd, Cs, Cu, Ga, Ge, In or Li, or a doped or non-doped metal oxide, e.g., TiO$_2$, ZnO, ZrO, SnO$_2$, WO$_3$ or Ta$_2$O$_3$. The dopant for the metal oxide can be one of Al, Mg, In, Li, Ga, Cd, Cs and Cu.

The electron is efficiently transported into the EML 850 by the ETL 864. The ETL 864 can be formed of an inorganic material and/or an organic material. The inorganic material for the ETL 864 can be selected from the group consisting of a doped or non-doped metal/non-metal oxide, e.g., TiO$_2$, ZnO, ZnMgO, ZrO, SnO$_2$, WO$_3$, Ta$_2$O$_3$, HfO$_3$, Al$_2$O$_3$, ZrSiO$_4$, BaTiO$_3$ or BaZrO$_3$, a doped or non-doped semiconductor particle, e.g., CdS, ZnSe or ZnS, nitride, e.g, Si$_3$N$_4$, and their combination. The dopant for the metal/non-metal oxide can be one of Al, Mg, In, Li, Ga, Cd, Cs and Cu, and the dopant for the semiconductor can be one of Al, Mg, In, Li, Ga, Cd, Cs and Cu.

The organic material for the ETL 864 can be an oxazole-based compound, an iso-oxazole-based compound, triazole-based compound, an isothiazole-based compound, an oxadiazole-based compound, a phenanthroline-based compound, a perylene-based compound, a benzoxazole-based compound, benzothiazole-based compound, benzimidazole-based compound, a pyrene-based compound, a triazine-based compound or an aluminum complex. For example, the organic material for the ETL 864 can be selected from the group consisting of 3-(biphenyl-4-yl)-5-(4-tertbutylphenyl)-4-phenyl-4H-1,2,4-triazole (TAZ), bathocuproine, 2,9-dimethyl-4,7-diphenyl-1,10-phenanthroline (BCP), 2,2',2"-(1,3,5-Benzinetriyl)-tris(1-phenyl-1-H-benzimidazole) (TPBi), 2-[4-(9,10-Di-2-naphthalenyl-2-anthracenyl)phenyl]-1-phenyl-1H-benzimidazole, tris(8-hydroxyquinoline)aluminum (Alq3), bis(2-methyl-8-quninolinato)-4-phenylphenolatealuminum (III) (Balq), 8-hydroxy-quinolinato lithium (Liq), bis(2-methyl-quinolinato)(tripnehylsiloxy) aluminum (III) (Salq) and their combination, but it is not limited thereto.

In FIG. 12, the second charge transporting layer 860 has a double-layered structure of the EIL 862 and the ETL 864. Alternatively, the second charge transporting layer 860 can have a single-layered structure of the ETL 864 without the EIL 862. In this instance, the ETL 864 can be formed of the above material with cesium carbonate.

The second charge transporting layer 860 including the EIL 862 and/or the ETL 864 can be formed by a vacuum deposition process, e.g., vacuum vapor deposition or sputtering, or a solution process, e.g., spin coating, drop coating, dip coating, spray coating, roll coating, flow coating, casting process, screen printing or inkjet printing. The vacuum deposition process and the solution process single or in combination are used for forming the first charge transporting layer 840. Each of the EIL 862 and the ETL 864 can have a thickness of 10 to 200 nm, beneficially 10 to 100 nm, but it is not limited thereto.

When the HTL 844 of the first charge transporting layer 840 is formed of an organic material and the second charge transporting layer 860 is formed of an inorganic material, the emitting property of the inorganic light emitting diode 800 can be improved. It can be referred to as a hybrid charge transporting layer structure.

On the other hand, when the hole is transported into the second electrode 820 or the electron is transported into the first electrode 810, the lifetime and the efficiency of the diode can be decreased. To prevent this problem, the inorganic light emitting diode 800 can further include at least one exciton blocking layer in the emitting layer 830.

For example, an electron blocking layer (EBL) can be formed between the HTL 844 and the EML 850. The EBL can be formed of TCTA, tris[4-(diethylamino)phenyl]amine), N-(biphenyl-4-yl)9,9-dimethyl-N-(4-(9-phenyl-9H-carbazole-3-yl)phenyl)-9H-fluorene-2-amine, tri-p-tolylamine, 1,1-bis(4-(N,N'-di(ptolyl)amino)phenyl) cyclohexane (TAPC), m-MTDATA, 1,3-bis(N-carbazolyl) benzene (mCP), 3,3'-bis(N-carbazolyl)-1,1-biphenyl (mCBP), poly-TPD, copper phthalocyanine (CuPc), DNTPD or 1,3,5-tris[4-(diphenylamino)phenyl]benzene (TDAPB).

In addition, a hole blocking layer (HBL) can be formed between the EML 850 and the ETL 864. The HBL can be formed of a material of ETL 864. For example, the HBL can be formed of an benzoxazole-based compound, a phenanthroline-based compound, a benzoxazole-based compound, benzothiazole-based compound, benzimidazole-based compound, a triazine-based compound or a pyrene-based compound.

The material of the HBL can have a highest occupied molecular orbital (HOMO) energy level being smaller than that of the EML 850. For example, the HBL can be formed of 2,9-dimethyl-4,7-diphenyl-1,10-phenanthroline (BCP), BAlq, Alq$_3$, PBD, spiro-PBD or Liq.

As mentioned above, by controlling a composition and a size of the inorganic emission particle 120, the luminous body 100 can emit various wavelength lights. The inorganic emission particle 120 including the core-shell structure has improved quantum efficiency. In addition, since the luminous body 100 includes the plurality of emission moieties 110 included in single encapsulation moiety 140, the density of the inorganic emission particle 120 is improved. Further, since the coating layer 130 covers or surrounds the surface of the inorganic emission particle 120, the FRET problem is prevented and the emission efficiency is improved. Moreover, due to the encapsulation moiety 140 and/or the curable moiety 150, the heating-resisting property of the luminous body 100 and the inorganic light emitting diode 800 is improved.

In FIG. 12, the inorganic light emitting diode has the normal structure. Namely, the HTL is positioned between the first electrode, which has a relatively low work function, and the EML, the ETL is positioned between the second electrode, which has a relatively high work function, and the EML. Alternatively, the diode can have an inverted structure.

In the inverted structure, the first electrode is a cathode, i.e., an electron injection electrode, and the second electrode is an anode, i.e., a hole injection electrode. The HBL is positioned between the first charge transporting layer and the EML, and the EBL is positioned between the second charge transporting layer and the EML.

Figure 13:
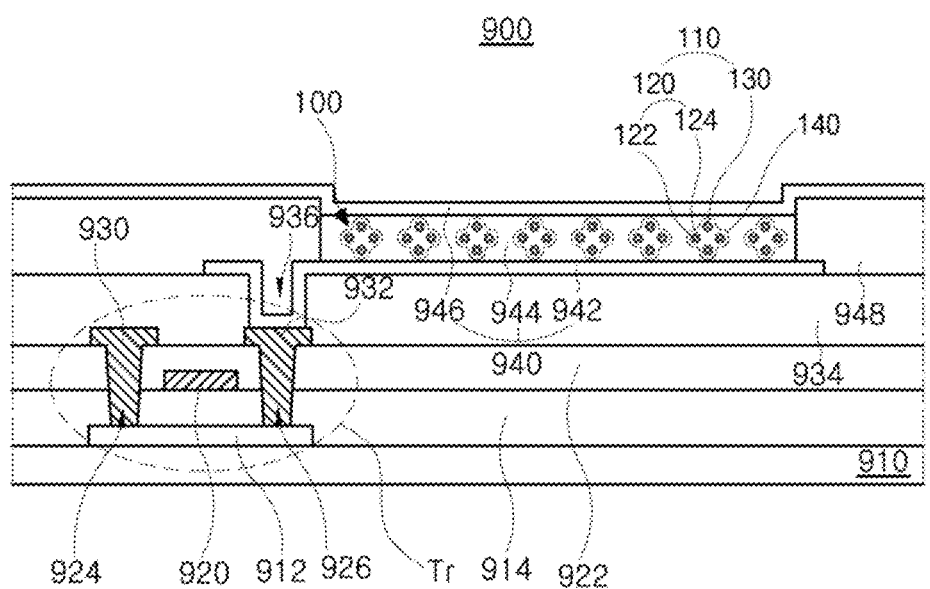
FIG. 13 is a schematic cross-sectional view illustrating an inorganic light emitting display device according to an embodiment of the present invention.

The inorganic light emitting diode including the luminous body 100 is used for the light emitting device such as the lighting device or the display device. FIG. 13 is a schematic cross-sectional view illustrating an inorganic light emitting display device according to an embodiment of the present invention.

As shown in FIG. 13, an inorganic light emitting display device 900 includes a substrate 910, a TFT Tr as a driving element on or over the substrate 910 and an inorganic light emitting diode 940 connected to the TFT Tr.

A semiconductor layer 912 is formed on the substrate 910. The semiconductor layer 912 can include an oxide semiconductor material or polycrystalline silicon. When the semiconductor layer 912 includes the oxide semiconductor material, a light-shielding pattern can be formed under the semiconductor layer 912. The light to the semiconductor layer 912 is shielded or blocked by the light-shielding pattern such that thermal degradation of the semiconductor layer 912 can be prevented. On the other hand, when the semiconductor layer 912 includes polycrystalline silicon, impurities can be doped into both sides of the semiconductor layer 912.

A gate insulating layer 914 is formed on the semiconductor layer 912. The gate insulating layer 914 can be formed of an inorganic insulating material such as silicon oxide or silicon nitride. A gate electrode 920, which is formed of a conductive material, e.g., metal, is formed on the gate insulating layer 914 to correspond to a center of the semiconductor layer 912.

An interlayer insulating layer 922, which is formed of an insulating material, is formed on an entire surface of the substrate 910 including the gate electrode 920. The interlayer insulating layer 922 can be formed of an inorganic insulating material, e.g., silicon oxide or silicon nitride, or an organic insulating material, e.g., benzocyclobutene or photo-acryl.

The interlayer insulating layer 922 includes first and second contact holes 924 and 926 exposing both sides of the semiconductor layer 912. The first and second contact holes 924 and 926 are positioned at both sides of the gate electrode 920 to be spaced apart from the gate electrode 920. A source electrode 930 and a drain electrode 932, which are formed of a conductive material, e.g., metal, are formed on the interlayer insulating layer 922.

The source electrode 930 and the drain electrode 932 are spaced apart from each other with respect to the gate electrode 920 and respectively contact both sides of the semiconductor layer 912 through the first and second contact holes 924 and 926. The semiconductor layer 912, the gate electrode 920, the source electrode 930 and the drain electrode 932 constitute the TFT Tr as the driving element.

In FIG. 13, the gate electrode 920, the source electrode 930 and the drain electrode 932 are positioned over the semiconductor layer 912. Namely, the TFT Tr has a coplanar structure. Alternatively, in the TFT Tr, the gate electrode can be positioned under the semiconductor layer, and the source and drain electrodes can be positioned over the semiconductor layer such that the TFT Tr can have an inverted staggered structure. In this instance, the semiconductor layer can include amorphous silicon.

A gate line and a data line are disposed on or over the substrate 910 and cross each other to define a pixel region. In addition, a switching element, which is electrically connected to the gate line and the data line, can be disposed on the substrate 910. The switching element is electrically connected to the TFT Tr as the driving element. In addition, a power line, which is parallel to and spaced apart from the gate line or the data line, can be formed on or over the substrate 910. Moreover, a storage capacitor for maintaining a voltage of the gate electrode 920 of the TFT Tr during one frame, can be further formed on the substrate 910.

A passivation layer 934, which includes a drain contact hole 936 exposing the drain electrode 932 of the TFT Tr, is formed to cover the TFT Tr.

A first electrode 942, which is connected to the drain electrode 932 of the TFT Tr through the drain contact hole 936, is separately formed in each pixel region and on the passivation layer 934. The first electrode 942 can be formed of a conductive material having a relatively high work function. The first electrode 942 can serve as an anode or a cathode. For example, the first electrode 942 can be formed of ITO, IZO, ITZO, ICO, $SnO_2$, $In_2O_3$, Cd:ZnO, F:$SnO_2$, In:$SnO_2$, Ga:SnO, AZO, Ni, Pt, Au, Ag, Ir or carbon nanotube (CNT). The above materials can be doped or non-doped.

When the inorganic light emitting display device 900 is operated in a top-emission type, a reflection electrode or a reflection layer can be formed under the first electrode 942. For example, the reflection electrode or the reflection layer can be formed of aluminum-palladium-copper (APC) alloy.

A bank layer 948, which covers edges of the first electrode 942, is formed on the passivation layer 934. A center of the first electrode 942 in the pixel region is exposed through an opening of the bank layer 948.

An emitting layer 944 including the luminous body 100 is formed on the first electrode 942. The emitting layer 944 can include an EML of the luminous body 100. Alternatively, to improve the emission efficiency, the emitting layer 944 can further include at least one charge transporting layer. For example, the emitting layer 944 can further include a first charge transporting layer 840 (of FIG. 12) between the first electrode 942 and the EML and a second charge transporting layer 860 (of FIG. 12) between the second electrode 946 and the EML.

A second electrode 946 is formed over the substrate 910 including the emitting layer 944. The second electrode 946 is positioned at an entire surface of the display area. The second electrode 946 can be formed of a conductive material having a relatively low work function. The second electrode 946 can serve as a cathode or an anode. For example, the second electrode 946 can be formed of Ca, Ba, Ca/Al, LiF/Ca, LiF/Al, $BaF_2$/Al, CsF/Al, $CaCO_3$/Al, $BaF_2$/Ca/Al, Al, Mg, Au—Mg alloy or Ag—Mg alloy.

The luminous body 100 in the emitting layer 944 includes an emission moiety 110, an encapsulation moiety 140 surrounding the emission moiety 110, and optionally further includes a curable moiety 150 (of FIG. 2A). The emission moiety 110 includes an inorganic emission particle 120 and a coating layer 130 surrounding the inorganic emission particle 120. The inorganic emission particle 120 can include a core 122 and a shell 124 surrounding the core 122. The wavelength of light from the emission moiety 110 can be controlled according to the composition and/or the size of the core 122 and/or a thickness of the shell 124.

Since each of the luminous body 100 includes the plurality of emission moieties 110 included in single encapsulation moiety 140, the density of the inorganic emission particle 120 is improved. Further, since the coating layer 130 covers or surrounds the surface of the inorganic emission particle 120, the FRET problem is prevented and the emission efficiency is improved. Moreover, due to the encapsulation moiety 140 and/or the curable moiety 150, the heat-ing-resisting property of the luminous body 100, the inorganic light emitting diode 940 and the inorganic light emitting display device 900 is improved.

[Synthesis of Red Luminous Body]

As described with FIG. 2B, the red luminous body is synthesized. The InP/ZnSe/ZnS structure red QD was used as the inorganic emission particle. CTAB was added into the QD to grow a reactive ligand at a surface of the QD. After TEOS and NaOH were added, the mixture was reacted under a temperature of 60° C. for about 3 hrs such that silica having hydroxyl group surface was coated on the QD surface. TEOS was added again to stably form the silica coating layer at the QD surface. GPTS was added, and the mixture was stored during the night such that GPTS as a curable moiety was combined to the silica coating layer. Next, TMMS as an encapsulation moiety was added, and the mixture was stored under a temperature of 150° C. during the night such that siloxane, which has an epoxy group as the curable moiety, was connected and the encapsulation moiety of TMMS was grown.

Figure 14:
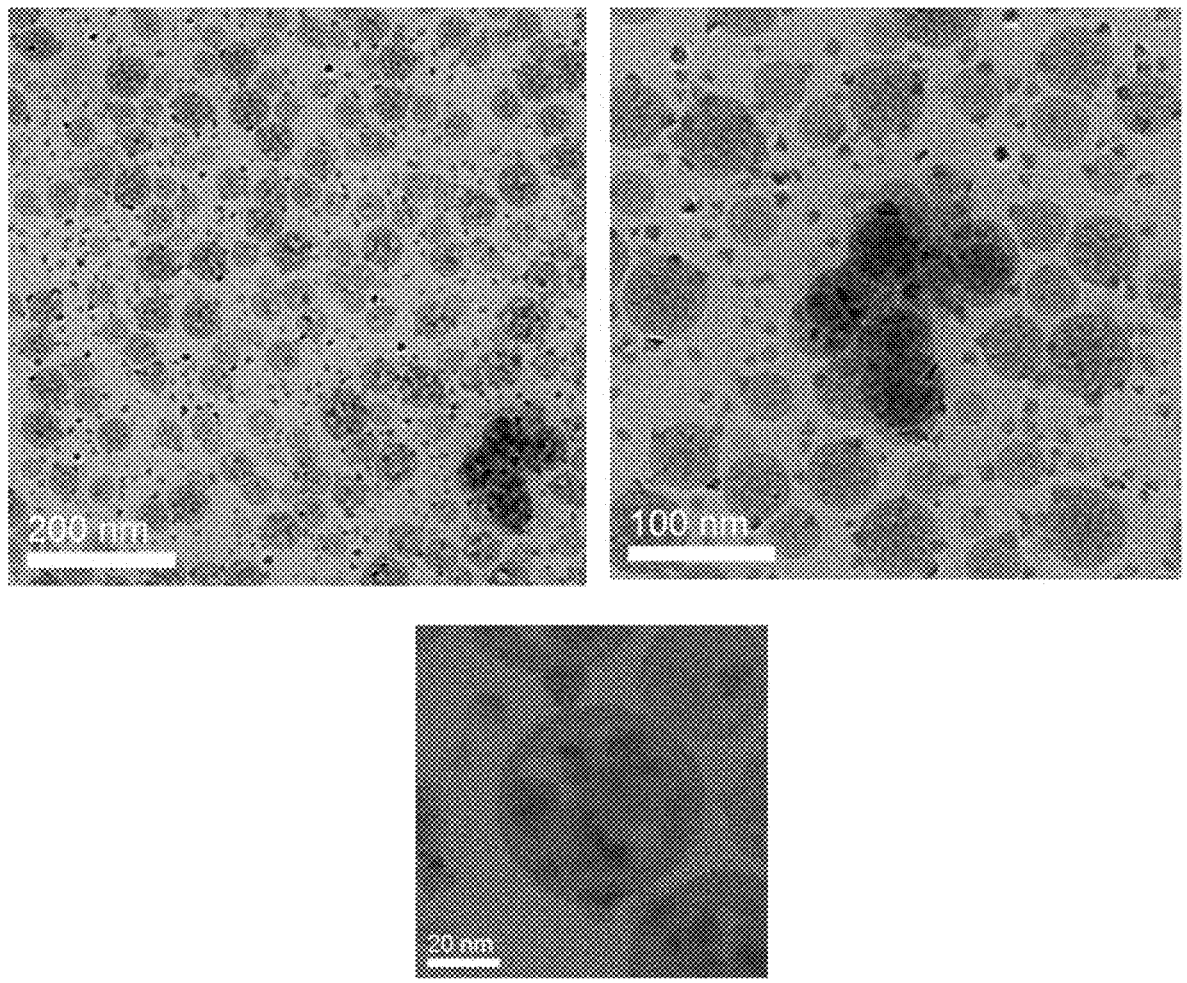
FIG. 14 shows TEM pictures of a luminous body with different scales.

FIG. 14 shows TEM pictures of a luminous body with different scales. As shown in FIG. 14, a plurality of QDs as the inorganic emission particle are included in the encapsulation moiety as a circular shape.

[Formation of a Thin Layer Using the Red Luminous Body]

The red luminous body is coated on an ITO glass substrate by a spin-coating process. A soft baking process is performed onto the coated layer under a temperature of 100° C. for 3 minutes, and an exposing process of 50 mJ/cm² is performed onto the coated layer. A hard baking process is performed onto the coated layer under a temperature of 150° C. for 30 minutes such that a thin layer including the luminous body is formed. The thin layer is marked by "QD SIOC".

[A Thin Layer of Comparative Example]

The InP/ZnSe/ZnS red QD is used instead of the luminous body, and acrylate as a binder is used to form a thin layer by the processes above. This thin layer is marked by "QD PR".

[Property of the Thin Layers]

Figure 15:
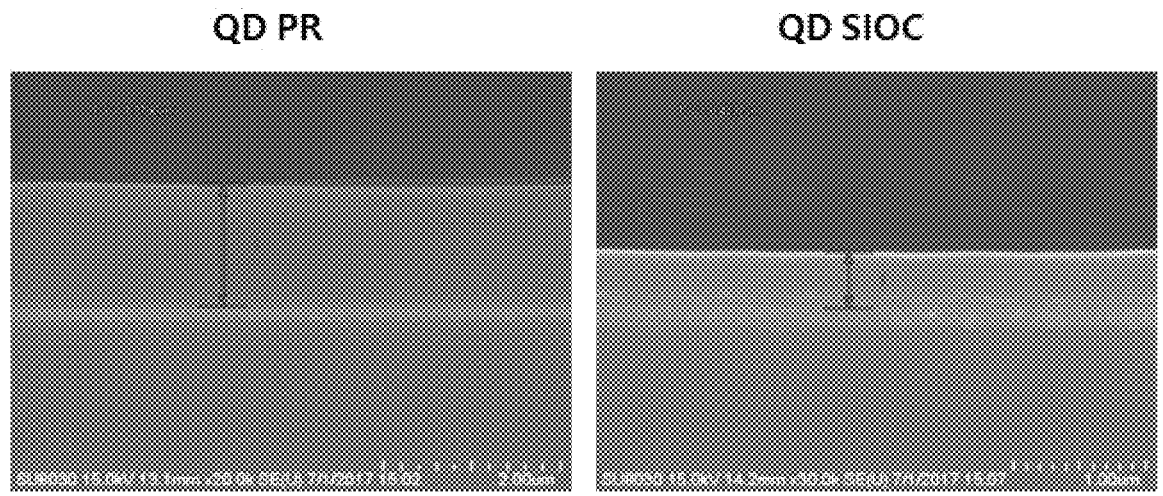
FIG. 15 is a TEM picture of a thin layer including a luminous body of the present invention and a thin layer including the related art inorganic luminous body in a cross section.

The property of the thin layers "QD SIOC" and "QD PR" is measured. The TEM pictures of the thin layers "QD PR" and "QD SIOC" are shown in FIGS. 15A and 15B, respectively. The thin layer "QD PR" has a thickness of 1.379 μm, and the thin layer "QD SIOC" has a thickness of 0.423 μm. Namely, the thickness of the thin layer "QD SIOC" can be about ⅓ of that of the thin layer "QD PR".

Figure 16:
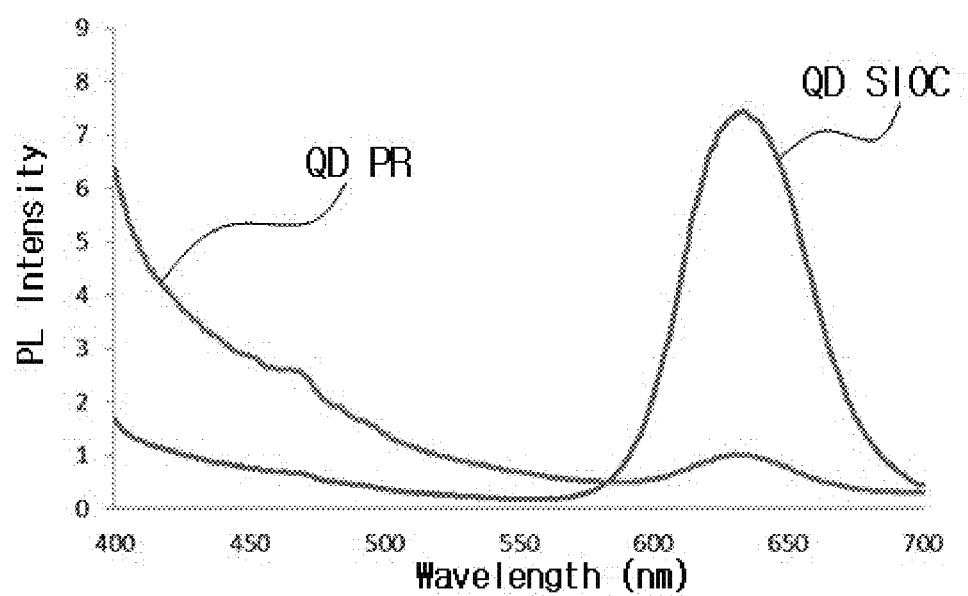
FIG. 16 is a graph showing a PL intensity of a thin layer including a luminous body of the present invention and a thin layer including the related art inorganic luminous body.

The PL intensity of the thin layers "QD PR" and "QD SIOC" are measured and shown in FIG. 16. The thin layers "QD PR" and "QD SIOC" have a maximum PL intensity at 635 nm. The maximum PL intensity of the thin layer "QD PR" is about 1.02, while the maximum PL intensity of the thin layer "QD SIOC" is about 7.44. Namely, with the related art QD as the luminous body, the thin layer has a thickness of at least 6 μm, while the thin layer including the luminous boy of the present invention has a sufficient brightness with smaller thickness, i.e., less than 1.8 μm.

It will be apparent to those skilled in the art that various modifications and variations can be made in the embodiments of the invention without departing from the spirit or scope of the invention. Thus, it is intended that the modifications and variations cover this invention provided they come within the scope of the appended claims and their equivalents.

What is claimed is:

1. A light emitting display device, comprising:
   a substrate;
   a light emitting diode over the substrate; and
   a color conversion layer between the substrate and the light emitting diode or over the light emitting diode and including a plurality of luminous bodies,
   wherein each luminous body includes:
      a plurality of emission moieties, each emission moiety including an inorganic emission particle and a coating layer surrounding a surface of the inorganic emission particle, and
      an encapsulation moiety connected to or combined with the coating layer of the plurality of emission moieties by a covalent bond and surrounding the plurality of emission moieties,
   wherein the inorganic emission particle comprises a core and a shell surrounding the core,
   wherein the coating layer covers the shell and surrounds an outer surface of the inorganic emission particle,
   wherein the coating layer includes a material selected from the group consisting of $SiO_2$, $TiO_2$, $Al_2O_3$, $ZrO_2$, ZnO, niobium, zirconium, cerium and silicate,
   wherein each luminous body further includes a curable moiety connected to an outer surface of the coating layer by a covalent bond,
   wherein the coating layer is modified to include a hydroxyl group at a surface of the coating layer, and
   wherein the encapsulation moiety comprises a silicone-based material.

2. The light emitting display device according to claim 1, wherein a red pixel region is defined in the substrate, and the color conversion layer includes a red color conversion layer in the red pixel region, and
   wherein a light from the light emitting diode is converted into a red wavelength light by the luminous body in the red color conversion layer.

3. The light emitting display device according to claim 2, wherein a green pixel region is further defined in the substrate, and the color conversion layer further includes a green color conversion layer in the green pixel region, and
   wherein the light from the light emitting diode is converted into a green wavelength light by the luminous body in the green color conversion layer.

4. The light emitting display device according to claim 1, wherein a red pixel region and a green pixel region are defined in the substrate, and the color conversion layer covers the red pixel region and the green pixel region, and
   wherein a light from the light emitting diode is converted into a red-green wavelength light by the luminous body in the color conversion layer.

5. The light emitting display device according to claim 1, further comprising: a color filter layer,
   wherein the color conversion layer is positioned between the light emitting diode and the color filter layer.

6. An inorganic light emitting display device, comprising:
   a substrate;
   an inorganic light emitting diode including a first electrode, a second electrode facing the first electrode and an emitting layer between the first and second electrodes and including a plurality of luminous bodies; and
   a driving element between the substrate and the inorganic light emitting diode and connected to the inorganic light emitting diode,
   wherein each luminous body includes:
      a plurality of emission moieties, each emission moiety including an inorganic emission particle and a coating layer surrounding a surface of the inorganic emission particle, and
      an encapsulation moiety connected to or combined with the coating layer of the plurality of emission moieties by a covalent bond and surrounding the plurality of emission moieties,
   wherein the inorganic emission particle comprises a core and a shell surrounding the core,
   wherein the coating layer covers the shell and surrounds an outer surface of the inorganic emission particle,
   wherein the coating layer includes a material selected from the group consisting of $SiO_2$, $TiO_2$, $Al_2O_3$, $ZrO_2$, ZnO, niobium, zirconium, cerium and silicate,
   wherein each luminous body further includes a curable moiety connected to an outer surface of the coating layer by a covalent bond,
   wherein the coating layer is modified to include a hydroxyl group at a surface of the coating layer, and
   wherein the encapsulation moiety comprises a silicone-based material.

7. The light emitting display device according to claim 1, wherein the coating layer has a porous property.

8. The light emitting display device according to claim 1, wherein the curable moiety is a monomer or an oligomer capable of forming a siloxane resin.

9. The light emitting display device according to claim 1, wherein the inorganic emission particle is a quantum dot or a quantum rod.

10. The light emitting display device according to claim 1, wherein a blue pixel region is further defined in the substrate, and the color conversion layer further includes a blue color conversion layer in the blue pixel regions, and
    wherein a light from the light emitting diode is converted into a blue wavelength light by the luminous body in the blue color conversion layer.

11. The light emitting display device according to claim 6, wherein the coating layer has a porous property.

12. The light emitting display device according to claim 6, wherein the curable moiety is a monomer or an oligomer capable of forming a siloxane resin.

13. The light emitting display device according to claim 6, wherein the inorganic emission particle is a quantum dot or a quantum rod.

14. The light emitting display device according to claim 6, wherein the emitting layer includes an emitting material layer, a first charge transporting layer between the first electrode and the emitting material layer and a second charge transporting layer between the emitting material layer and the second electrode, and wherein the emitting material layer includes the plurality of luminous bodies.

15. The light emitting display device according to claim 1, wherein the curable moiety is extended from the outer surface of the coating layer to an outside of the encapsulation moiety by penetrating through the encapsulation moiety.

16. The light emitting display device according to claim 1, wherein the curable moiety includes a curable functional moiety, and wherein the curable functional moiety includes an acrylate group, a methacrylate group, a vinyl group, an epoxy group, a glycidoxy group, a hydroxyl group, a halogen group, an amine group, an amino group, a nitro group, an amide group, a mercapto group or a cyano group.

17. The light emitting display device according to claim 6, wherein the curable moiety is extended from the outer surface of the coating layer to an outside of the encapsulation moiety by penetrating through the encapsulation moiety.

18. The light emitting display device according to claim 6, wherein the curable moiety includes a curable functional moiety, and wherein the curable functional moiety includes an acrylate group, a methacrylate group, a vinyl group, an epoxy group, a glycidoxy group, a hydroxyl group, a halogen group, an amine group, an amino group, a nitro group, an amide group, a mercapto group or a cyano group.

* * * * *